US009859141B2

(12) United States Patent
Johnson et al.

(10) Patent No.: US 9,859,141 B2
(45) Date of Patent: Jan. 2, 2018

(54) APPARATUS AND METHOD FOR ALIGNING AND CENTERING WAFERS

(71) Applicant: SUSS MicroTec Lithography, GmbH, Garching (DE)

(72) Inventors: Hale Johnson, Jericho, VT (US); Gregory George, Colchester, VT (US); Michael Brennen, Irasburg, VT (US)

(73) Assignee: SUSS MicroTec Lithography GmbH (DE)

( * ) Notice: Subject to any disclaimer, the term of this patent is extended or adjusted under 35 U.S.C. 154(b) by 488 days.

(21) Appl. No.: 14/330,497

(22) Filed: Jul. 14, 2014

(65) Prior Publication Data

US 2014/0319786 A1    Oct. 30, 2014

Related U.S. Application Data

(60) Provisional application No. 61/847,118, filed on Jul. 17, 2013.

(51) Int. Cl.
*H01L 21/68* (2006.01)
*H01L 21/67* (2006.01)

(52) U.S. Cl.
CPC ........ *H01L 21/68* (2013.01); *H01L 21/67092* (2013.01); *Y10T 279/18* (2015.01); *Y10T 279/21* (2015.01); *Y10T 279/26* (2015.01)

(58) Field of Classification Search
CPC . H01L 21/67092; H01L 21/68; H01L 21/683; H01L 21/687; H01L 21/68728;
(Continued)

(56) References Cited

U.S. PATENT DOCUMENTS 4,189,230 A    2/1980 Zasio
5,421,056 A    6/1995 Tateyama et al.
(Continued)

FOREIGN PATENT DOCUMENTS

CN    102460677 A    5/2012
DE    102006031434 A1    1/2008
(Continued)

OTHER PUBLICATIONS

Kharas, D. et al., "Cycle Time and Cost Reduction Benefits of an Automated Bonder and Debonder System for a High Volume 150 mm GaAs HBT Back-end Process Floe," CS Mantech Conference, May 18-21, 2009, Tampa, Forida, USA, 4 pages.
(Continued)

*Primary Examiner* — Daniel Howell
*Assistant Examiner* — Paul M Janeski
(74) *Attorney, Agent, or Firm* — Hayes Soloway PC

(57) ABSTRACT

A device for locating and engaging a notch on the perimeter of a circular wafer includes a notch locating component and a first plate. The notch locating component is configured to move linearly along a first axis and includes a front elongated component extending along a second axis perpendicular to the first axis and having a front surface, a back surface opposite to the front surface and a first protrusion extending from the front surface of the elongated component. The first protrusion has a shape complementing the shape of a notch formed on the perimeter of a circular wafer. As the notch locating component is driven toward the perimeter of the circular wafer along the first axis, a distance between the back surface of the elongated component and a front surface of the first plate is measured and the value of the measured distance is used to determine engagement of the first protrusion with the notch.

7 Claims, 24 Drawing Sheets

(58) Field of Classification Search
CPC ... H01L 21/6875; Y10T 279/21; Y10T 279/26
See application file for complete search history.

(56) References Cited

U.S. PATENT DOCUMENTS

| | | | |
|---|---|---|---|
| 6,062,953 | A | 5/2000 | Takaya et al. |
| 6,073,576 | A | 6/2000 | Moslehi et al. |
| 6,143,147 | A | 11/2000 | Jelinek |
| 6,183,354 | B1 | 2/2001 | Zuniga et al. |
| 6,216,883 | B1 | 4/2001 | Kobayashi et al. |
| 6,217,034 | B1 | 4/2001 | Smedt et al. |
| 6,231,038 | B1 | 5/2001 | Keyser et al. |
| 6,485,248 | B1 | 11/2002 | Taylor, Jr. |
| 6,540,594 | B2 | 4/2003 | Zuniga et al. |
| 6,612,590 | B2 | 9/2003 | Coomer et al. |
| 6,652,656 | B2 | 11/2003 | Kopacz et al. |
| 6,682,113 | B2 | 1/2004 | Cox et al. |
| 6,692,219 | B2 | 2/2004 | Coomer et al. |
| 6,767,846 | B2 | 7/2004 | Kopacz et al. |
| 6,792,991 | B2 | 9/2004 | Thallner |
| 6,797,190 | B2 | 9/2004 | Hsu et al. |
| 6,857,838 | B2 | 2/2005 | Kuroda et al. |
| 6,869,266 | B2 | 3/2005 | Coomer et al. |
| 7,087,122 | B2 | 8/2006 | Smith et al. |
| 7,367,773 | B2 | 5/2008 | Buitron et al. |
| 7,547,053 | B2 | 6/2009 | Yoshida et al. |
| 7,644,968 | B2 | 1/2010 | Hirooka et al. |
| 7,670,437 | B2 | 3/2010 | Allen et al. |
| 7,712,808 | B2 | 5/2010 | Hofmeister et al. |
| 7,748,760 | B2 | 7/2010 | Kushida et al. |
| 7,789,443 | B2 | 9/2010 | Gillespie et al. |
| 7,988,807 | B2 | 8/2011 | Noda et al. |
| 8,118,640 | B2 | 2/2012 | Takahashi et al. |
| 8,130,372 | B2 | 3/2012 | Harless et al. |
| 8,166,641 | B2 | 5/2012 | Han et al. |
| 8,267,143 | B2 | 9/2012 | George et al. |
| 8,454,068 | B2 | 6/2013 | Hashimoto et al. |
| 8,545,165 | B2 | 10/2013 | Moura et al. |
| 8,622,451 | B2 | 1/2014 | Mantz |
| 8,702,142 | B2 | 4/2014 | Kim |
| 8,752,872 | B2 | 6/2014 | Kent |
| 8,764,085 | B2 | 7/2014 | Urabe et al. |
| 8,776,363 | B2 | 7/2014 | Hsu et al. |
| 8,801,069 | B2 | 8/2014 | Hosek et al. |
| 2001/0000775 | A1 | 5/2001 | Zuniga et al. |
| 2001/0013684 | A1 | 8/2001 | Smedt et al. |
| 2002/0049024 | A1 | 4/2002 | Zuniga et al. |
| 2002/0064450 | A1 | 5/2002 | Coomer et al. |
| 2002/0066475 | A1 | 6/2002 | Verhaverbeke et al. |
| 2002/0086624 | A1 | 7/2002 | Zuniga et al. |
| 2002/0180466 | A1 | 12/2002 | Hiramatsu |
| 2003/0094824 | A1 | 5/2003 | Cox et al. |
| 2003/0170424 | A1 | 9/2003 | Roberds et al. |
| 2003/0198547 | A1 | 10/2003 | Coomer et al. |
| 2004/0005212 | A1 | 1/2004 | Wu |
| 2004/0033769 | A1 | 2/2004 | Zuniga et al. |
| 2004/0082192 | A1 | 4/2004 | Kopacz et al. |
| 2004/0159343 | A1 | 8/2004 | Shimbara et al. |
| 2005/0037698 | A1 | 2/2005 | Zuniga et al. |
| 2005/0211867 | A1 | 9/2005 | Margeson |
| 2006/0115578 | A1 | 6/2006 | Brand et al. |
| 2006/0234503 | A1 | 10/2006 | Yamada et al. |
| 2006/0258273 | A1 | 11/2006 | Koh et al. |
| 2006/0264004 | A1 | 11/2006 | Tong et al. |
| 2006/0289992 | A1 | 12/2006 | Wood |
| 2007/0277187 | A1 | 11/2007 | Fujisawa |
| 2008/0008565 | A1 | 1/2008 | Thallner |
| 2008/0175693 | A1 | 7/2008 | Fujii |
| 2008/0200011 | A1 | 8/2008 | Pillalamarri et al. |
| 2008/0271845 | A1 | 11/2008 | Keite-Telgenbuscher et al. |
| 2008/0302481 | A1 | 12/2008 | Berger et al. |
| 2009/0017323 | A1 | 1/2009 | Webb et al. |
| 2009/0038750 | A1 | 2/2009 | Hong et al. |
| 2009/0133812 | A1 | 5/2009 | Noda et al. |
| 2009/0141418 | A1 | 6/2009 | Hwang |
| 2009/0165277 | A1 | 7/2009 | Zussy et al. |
| 2009/0218560 | A1 | 9/2009 | Flaim et al. |
| 2009/0258583 | A1 | 10/2009 | Thallner |
| 2010/0038035 | A1 | 2/2010 | Noda et al. |
| 2010/0041211 | A1 | 2/2010 | Noda et al. |
| 2010/0211210 | A1 | 8/2010 | Fujii |
| 2010/0263794 | A1 | 10/2010 | George et al. |
| 2011/0209832 | A1 | 9/2011 | Tawara |
| 2014/0311532 | A1 | 10/2014 | Yokoyama et al. |

FOREIGN PATENT DOCUMENTS

| | | |
|---|---|---|
| EP | 1042790 | 10/2000 |
| EP | 1340246 | 9/2003 |
| EP | 1550156 | 7/2005 |
| EP | 1690292 | 8/2006 |
| JP | 2003197724 | 7/2003 |
| KR | 1020050004904 | 1/2005 |
| KR | 1020050033440 | 4/2005 |
| KR | 1020060028439 | 3/2006 |
| KR | 1020060031701 | 4/2006 |
| WO | WO 00/26943 A1 | 5/2000 |
| WO | WO 02/45137 A2 | 6/2002 |
| WO | WO 2004/006296 A2 | 1/2004 |
| WO | WO 2005/057651 A1 | 6/2005 |
| WO | 2006137476 A1 | 12/2006 |
| WO | WO 2008/008931 A1 | 1/2008 |
| WO | WO 2008/045669 A1 | 4/2008 |
| WO | WO 2009/023387 A2 | 2/2009 |
| WO | WO 2009/094558 A2 | 7/2009 |
| WO | 2010121068 A2 | 10/2010 |
| WO | WO 2013/025629 A2 | 2/2013 |

OTHER PUBLICATIONS

Privett, M. et al., "TSV Thinned Wafer Debonding Process Optimization," undated, pp. 144-148.
EV Group Temporary Bonding/Debonding Systems EVG 850TB/DB, undated, 8 pages, May be retrieved at URL:http://www.evgroup.com/documents/brochures/evg850_tb_db_shortbrochure.pdf>.
PCT International Search Report, PCT Application No. PCT/EP2014/065315, Jan. 30, 2015, 5 pages.
PCT Written Opinion, PCT Application No. PCT/EP2014/065315, Jan. 30, 2015, 10 pages.
PCT International Search Report, PCT Application No. PCT/EP2014/065314, Jan. 29, 2015, 5 pages.
PCT Written Opinion, PCT Application No. PCT/EP2014/065314, Jan. 29, 2015, 13 pages.

APPARATUS AND METHOD FOR ALIGNING AND CENTERING WAFERS

CROSS REFERENCE TO RELATED CO-PENDING APPLICATIONS

This application claims the benefit of U.S. provisional application Ser. No. 61/847,118 filed Jul. 17, 2013 and entitled "APPARATUS AND METHOD FOR SEMICONDUCTOR WAFER LEVELING, FORCE BALANCING AND CONTACT SENSING", the contents of which are expressly incorporated herein by reference.

FIELD OF THE INVENTION

The present invention relates to an apparatus and a method for accurate aligning and centering of semiconductor wafers for wafer-to-wafer bonding applications.

BACKGROUND OF THE INVENTION

Wafer-to-wafer (W2W) bonding is deployed in a wide range of semiconductor process applications for forming semiconductor devices. Examples of semiconductor process applications where wafer-to-wafer bonding is applied include substrate engineering and fabrication of integrated circuits, packaging and encapsulation of micro-electro-mechanical-systems (MEMS) and stacking of many processed layers (3D-integration) of pure microelectronics. W2W bonding involves aligning the surfaces of two or more wafers, transporting the aligned wafers into a wafer bonding chamber, bringing the wafer surfaces in contact and forming a strong bond interface between them. The overall processing yield and manufacturing cost of the so produced semiconductor devices and ultimately the cost of the electronic products that incorporate these devices depend greatly upon the quality of the wafer-to-wafer bond. The quality of the W2W bond depends upon the alignment of the wafers, the preservation of the wafer alignment during the transport and the bonding process, and the uniformity and integrity of the bond strength across the wafer bond interfaces.

Furthermore, extreme care is needed during the transport, positioning, centering and alignment of the wafers in order to avoid fracture, surface damage, or warping of the wafers. Accordingly, it is desirable to provide an industrial-scale device for handling, centering and aligning wafers that protects them from fracture, surface damage or warping.

SUMMARY OF THE INVENTION

The invention provides an apparatus and a method for accurate aligning and centering of semiconductor wafers for wafer-to-wafer bonding applications. Centering and aligning of the wafers is assisted by locating and engaging a notch or a flat structure on the perimeter of a circular wafer.

In general, in one aspect, the invention features, a device for locating and engaging a notch on the perimeter of a circular wafer. The device includes a notch locating component and a first plate. The notch locating component is configured to move linearly along a first axis and comprises a front elongated component extending along a second axis perpendicular to the first axis and comprising a front surface, a back surface opposite to the front surface and a first protrusion extending from the front surface of the elongated component. The first protrusion has a shape complementing the shape of a notch formed on the perimeter of a circular wafer. The first plate is arranged at a first side of the front elongated component. As the notch locating component is driven toward the perimeter of the circular wafer along the first axis, a distance between the back surface of the elongated component and a front surface of the first plate is measured and the value of the measured distance is used to determine engagement of the first protrusion with the notch.

Implementations of this aspect of the invention include one or more of the following. The device further includes a position sensor and a floating joint connection configured to connect a front surface of the position sensor to the back surface of the front elongated component. The position sensor is configured to measure the distance between the back surface of the elongated component and the front surface of the first plate, as the notch locating component is driven toward the perimeter of the circular wafer along the first axis. The device further includes a second plate arranged at a second side of the front elongated component, opposite to the first side. The first and second plates support first and second rollers respectively, and the first and second rollers are configured to roll around the perimeter of the circular wafer. The device may further include second and third protrusions extending from the front surface of the front elongated component and being arranged left and right of the first protrusion, respectively. The second and third protrusions have a shape complementing the shape of the notch formed on the perimeter of the circular wafer. The position sensor may be a linear potentiometer. The notch locating component is driven toward the perimeter of the circular wafer along the first axis via a piston or a motor. The notch locating component also includes a triangular component and the front elongated component forms partially the base of the triangular component.

In general, in another aspect, the invention features, a device for locating and engaging a flat feature on the perimeter of a circular wafer including a flat feature locating component and a first plate. The flat feature locating component is configured to move linearly along a first axis and comprises a front elongated component extending along a second axis perpendicular to the first axis and comprising a front surface, a back surface opposite to the front surface, and a first protrusion extending from the front surface of the elongated component. The first protrusion comprises a shape complementing the shape of the flat feature formed on the perimeter of a circular wafer. The first plate is arranged at a first side of the front elongated component. As the notch locating component is driven toward the perimeter of the circular wafer along the first axis, a distance between the back surface of the elongated component and a front surface of the first plate is measured and the value of the measured distance is used to determine engagement of the first protrusion with the flat feature. The device may further include second and third protrusions extending from the front surface of the front elongated component and being arranged left and right of the first protrusion, respectively. The second and third protrusions comprise a shape complementing the shape of the flat feature formed on the perimeter of the circular wafer, and are located forward of the first protrusion.

In general, in another aspect, the invention features, a device for centering circular wafers including a support chuck, a first rotationally movable alignment arm, a second rotationally movable alignment arm, and a third linear moving alignment arm. The support chuck supports a circular wafer to be centered upon its top surface. The first rotationally movable alignment arm is rotatable around an axis perpendicular to the top surface of the support chuck and comprises a first mechanical jaw. The first mechanical jaw has a tapered curved edge surface conforming to the curved edge of the circular wafer. The second rotationally movable alignment arm is rotatable around an axis perpendicular to the top surface of the support chuck and comprises a second mechanical jaw. The second mechanical jaw has a tapered curved edge surface conforming to the curved edge of the circular wafer. The third linear moving alignment arm, is movable linearly along a first axis toward the center of the support chuck and includes a tapered curved inner surface conforming to the curved edge of the circular wafer and a notch locating mechanism configured to locate a notch formed on the perimeter of the circular wafer. The first, second and third alignment arms are arranged around the support chuck at an angle of 120 degrees from each other. The circular wafer is placed on the support chuck and is centered and aligned by first rotating the first and second alignment arms toward the center of the support chuck so that the tapered curved edge surfaces of the first and second mechanical jaws contact the outer perimeter of the circular wafer at first and second perimeter areas, respectively, and then by linearly moving the third alignment arm along the first axis toward the center of the support chuck until the notch locating mechanism locates and engages the notch formed on the perimeter the circular wafer.

The notch locating mechanism includes a notch locating component and a first plate. The notch locating component is configured to move linearly along the first axis toward the center of the support chuck and includes a front elongated component extending along a second axis being co-planar with the support chuck and perpendicular to the first axis. The front elongated component has a front surface, a back surface opposite to the front surface and a first protrusion extending from the front surface of the elongated component. The first protrusion has a shape complementing the shape of the notch formed on the perimeter of the circular wafer. The first plate is arranged at a first side of the front elongated component. As the notch locating component is driven forward toward the perimeter of the circular wafer along the first axis, a distance between the back surface of the elongated component and a front surface of the first plate is measured and the value of the measured distance is used to determine engagement of the first protrusion with the notch.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

Figure 1:
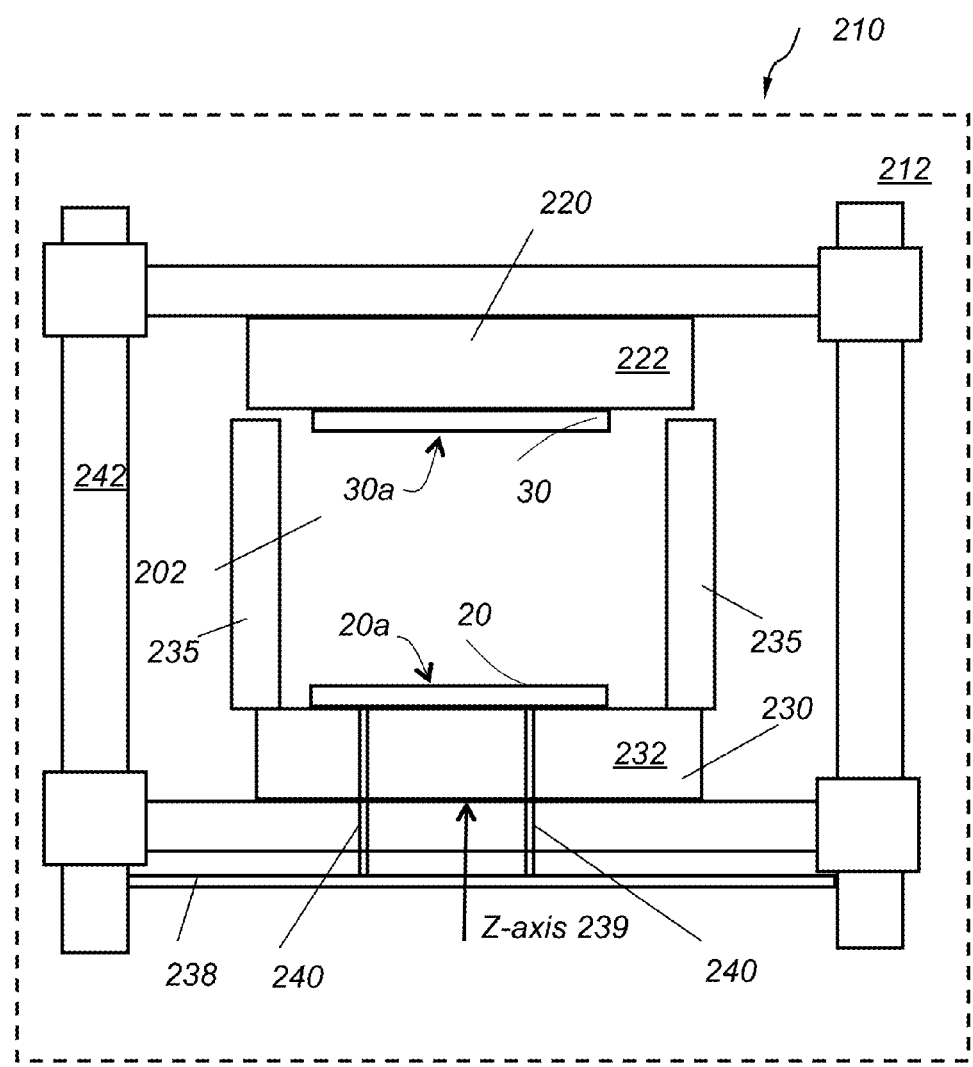
FIG. 1 depicts a schematic cross-sectional diagram of a temporary bonder module.
Figure 2:
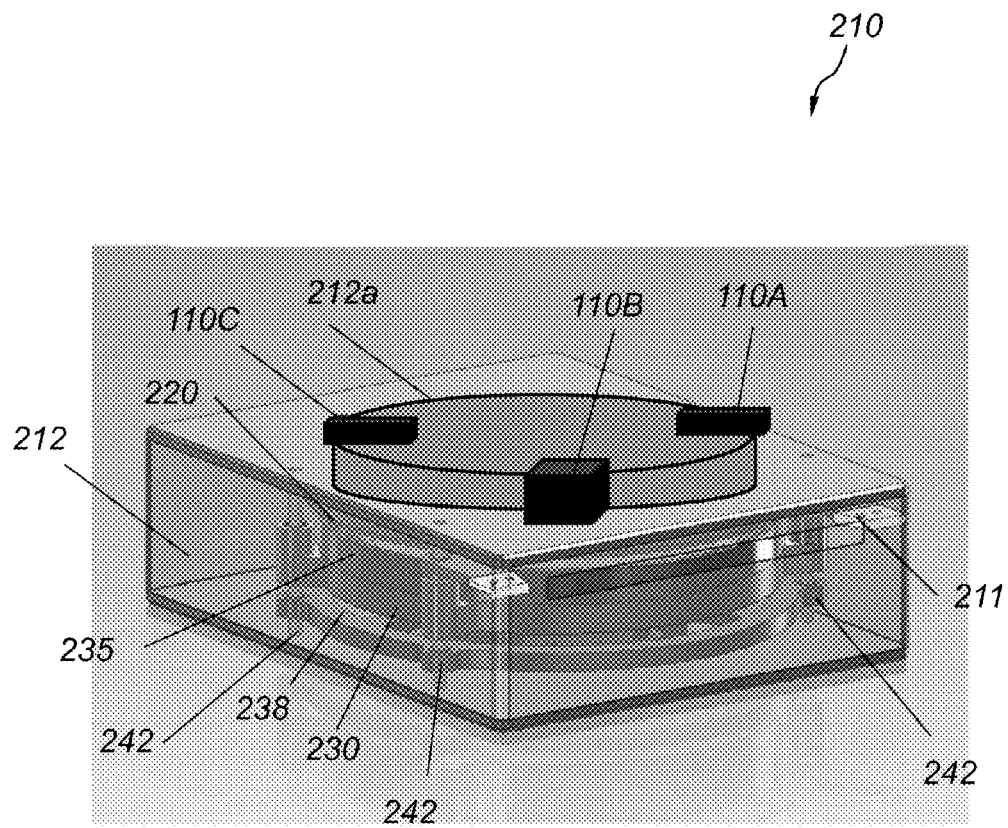
FIG. 2 depicts a temporary bonder module according to this invention.

Referring to FIG. 1-FIG. 6, a temporary wafer bonding module 210 includes a housing 212 having a top lid 212a, a load door 211, an upper block assembly 220 and an opposing lower block assembly 230. The upper and lower block assemblies 220, 230 are movably connected to four Z-guide posts 242. A telescoping curtain seal 235 is disposed between the upper and lower block assemblies 220, 230. A temporary bonding chamber 202 is formed between the upper and lower assemblies 220, 230 and the telescoping curtain seal 235. The curtain seal 235 keeps many of the process components that are outside of the temporary bonding chamber area 202 insulated from the process chamber temperature, pressure, vacuum, and atmosphere. Process components outside of the chamber area 202 include guidance posts 242, Z-axis drive 243, illumination sources, mechanical pre-alignment arms 460a, 460b and wafer centering jaws 461a, 461b, among others. In this embodiment, chamber 210 also includes three adjustment mechanisms 110A, 110B, 110C that are located outside of the bonding chamber area 202 and are accessible from the outside of the top lid 212a. Adjustment mechanisms 110A, 110B, 110C include components that are used for sensing substrate contact, adjusting the chuck downward preload and leveling a top chuck 222, as will be described below.

Figure 3:
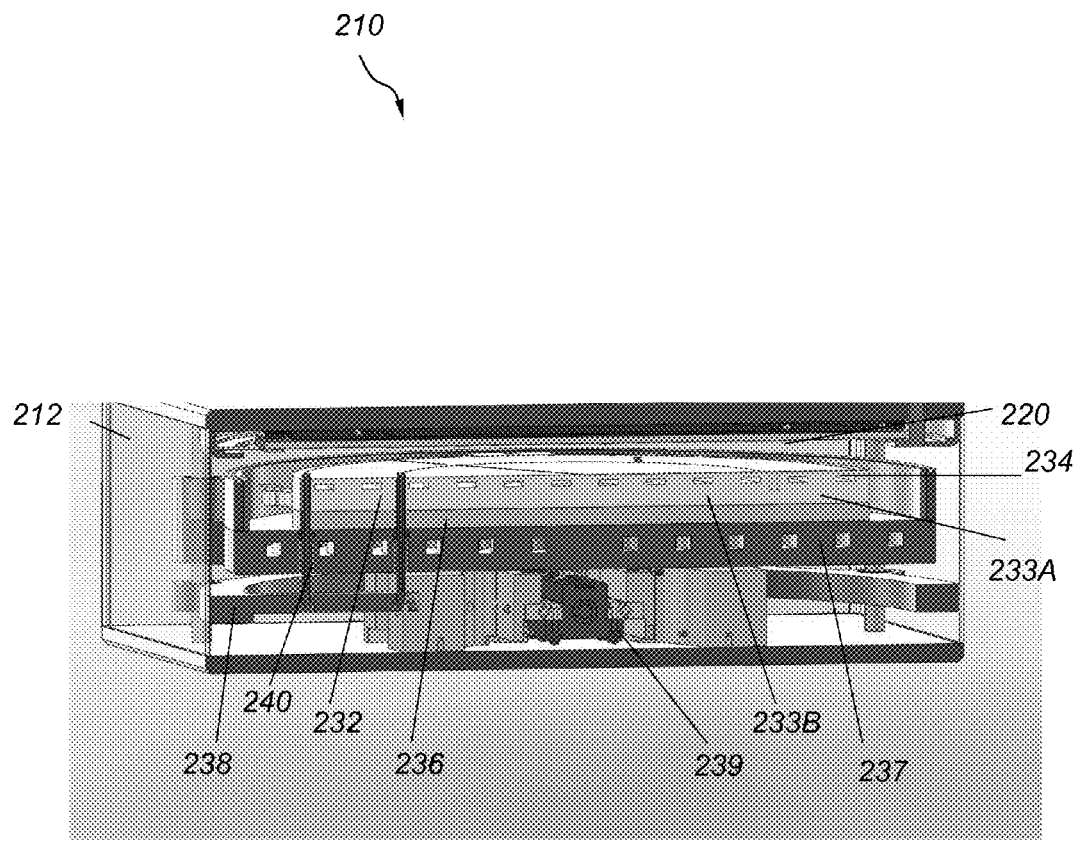
FIG. 3 depicts a cross-sectional view of the temporary wafer bonder module of FIG. 2 perpendicular to the load direction.
Figure 4:
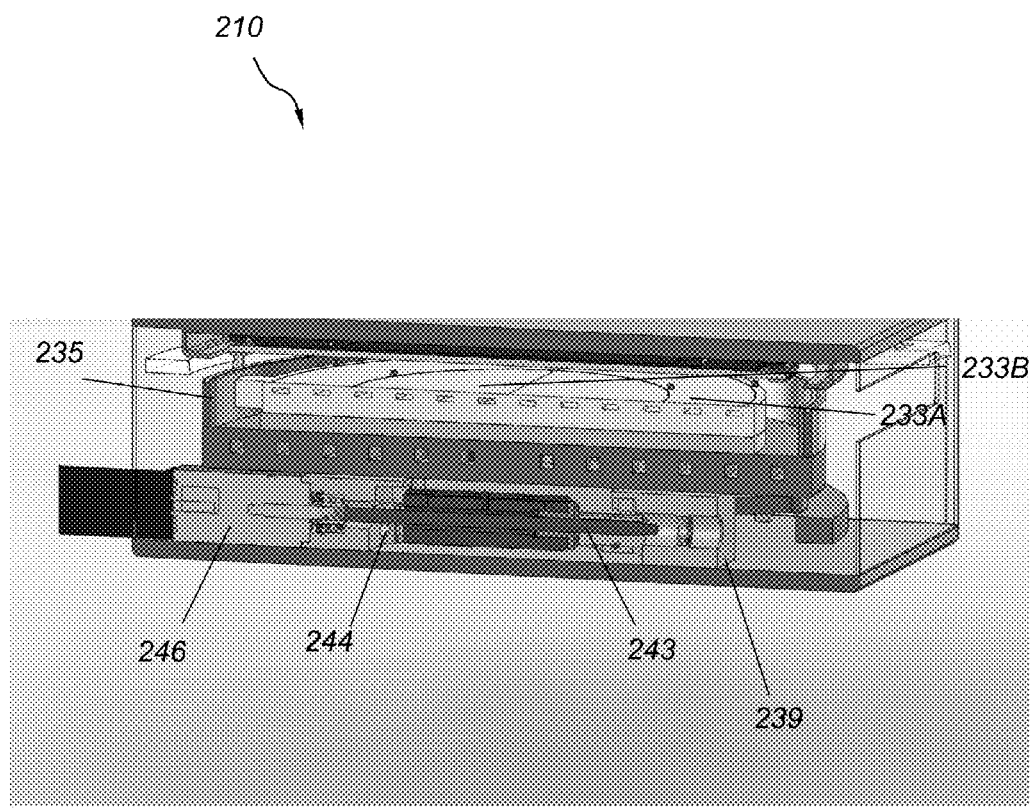
FIG. 4 depicts a cross-sectional view of the temporary wafer bonder module of FIG. 2 in line with the load direction.

Referring to FIG. 3, the lower block assembly 230 includes a heater plate (lower chuck) 232 supporting the wafer 20, an insulation layer 236, a water cooled support flange 237 a transfer pin stage 238, transfer pins 240 and a Z-axis block 239. Heater plate 232 is a ceramic plate and includes resistive heater elements 233 and integrated air cooling 234. Heater elements 233 are arranged so the two different heating zones are formed. A first heating zone 233B is configured to heat a 200 mm wafer or the center region of a 300 mm wafer and a second heating zone 233A is configured to heat the periphery of the 300 mm wafer. Heating zone 233A is controlled independently from heating zone 233B in order to achieve thermal uniformity throughout the entire bond interface between two stacked wafers and to mitigate thermal losses at the edges of the wafer stack. Heater plate 232 also includes two different vacuum zones for holding wafers of 200 mm and 300 mm, respectively. The water cooled thermal isolation support flange 237 is separated from the heater plate by the insulation layer 236. The transfer pin stage 238 is arranged below the lower block assembly 230 and is movable supported at the four posts 242. Transfer pin stage 238 supports transfer pins 240 arranged so that they can raise or lower different size wafers. In one example, the transfer pins 240 are arranged so that they can raise or lower 200 mm and 300 mm wafers. Transfer pins 240 are straight shafts and, in some embodiments, have a vacuum feed opening extending through their center. Vacuum drawn through the transfer pin openings holds the supported wafers in place onto the transfer pins during movement and prevents misalignment of the wafers. The Z-axis block 239 includes a precision Z-axis drive 243 with ball screw, linear cam design, a linear encoder feedback 244 for submicron position control, and a servomotor 246 with a gearbox, shown in FIG. 4.

Figure 6:
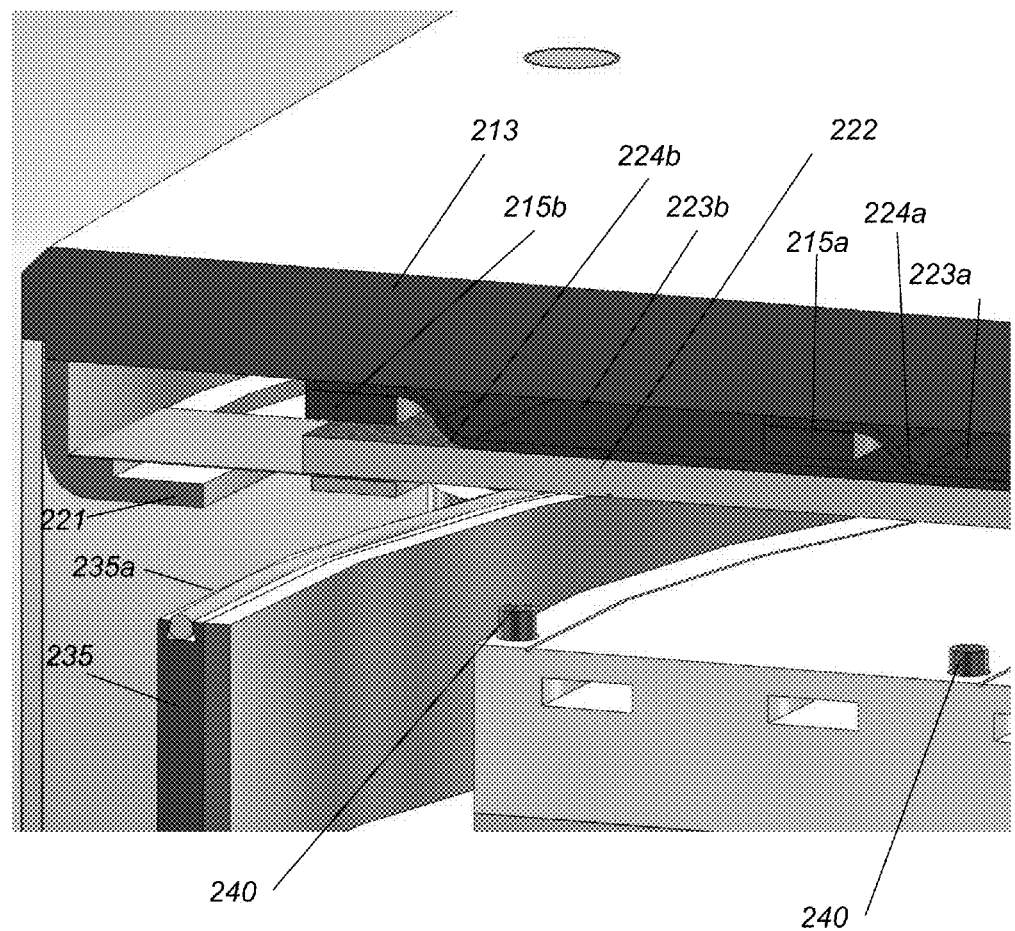
FIG. 6 depicts a cross-sectional view of the top chuck of the temporary wafer bonder module of FIG. 2.
Figure 7:
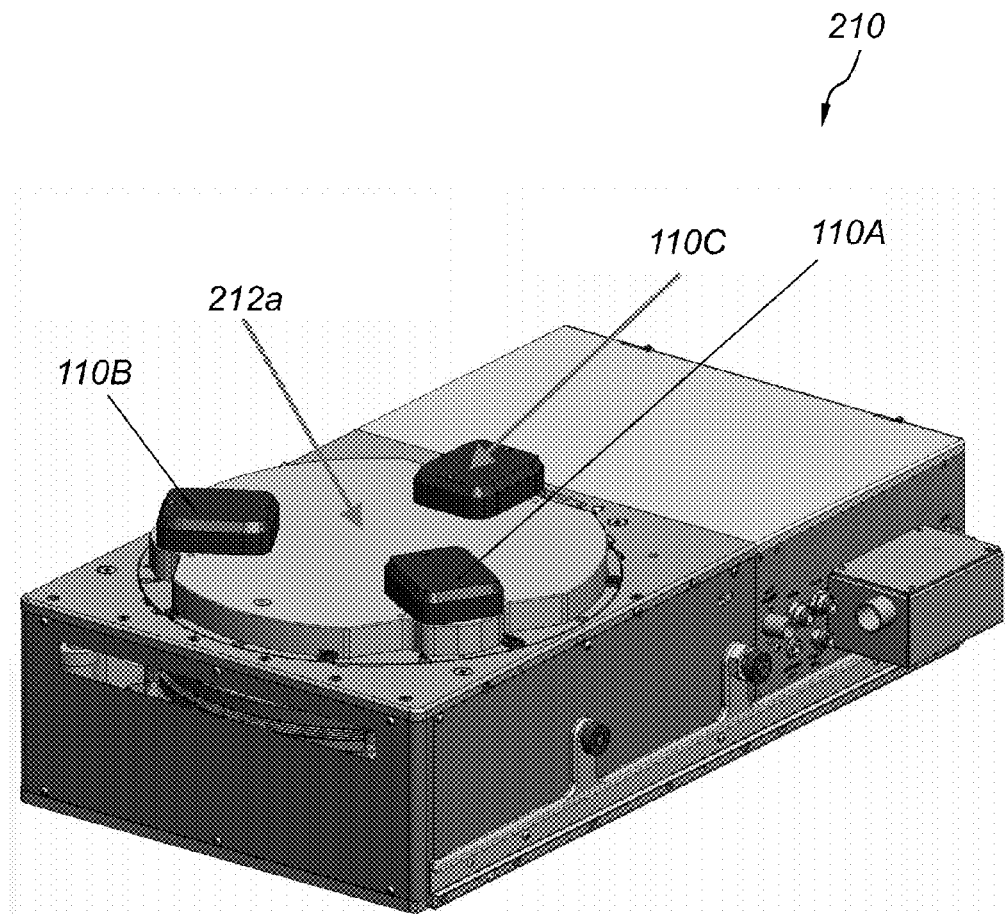
FIG. 7 depicts a top perspective view of the temporary wafer bonder module of FIG. 2.
Figure 8:
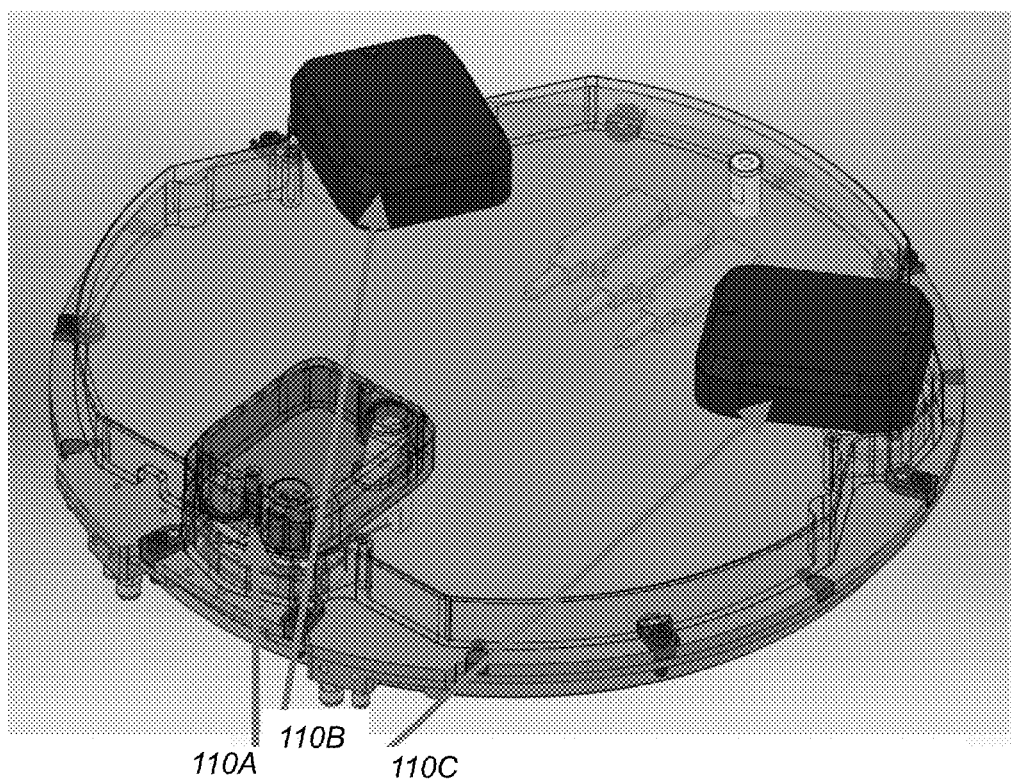
FIG. 8 depicts the top lid of the temporary wafer bonder module of FIG. 2.
Figure 9:
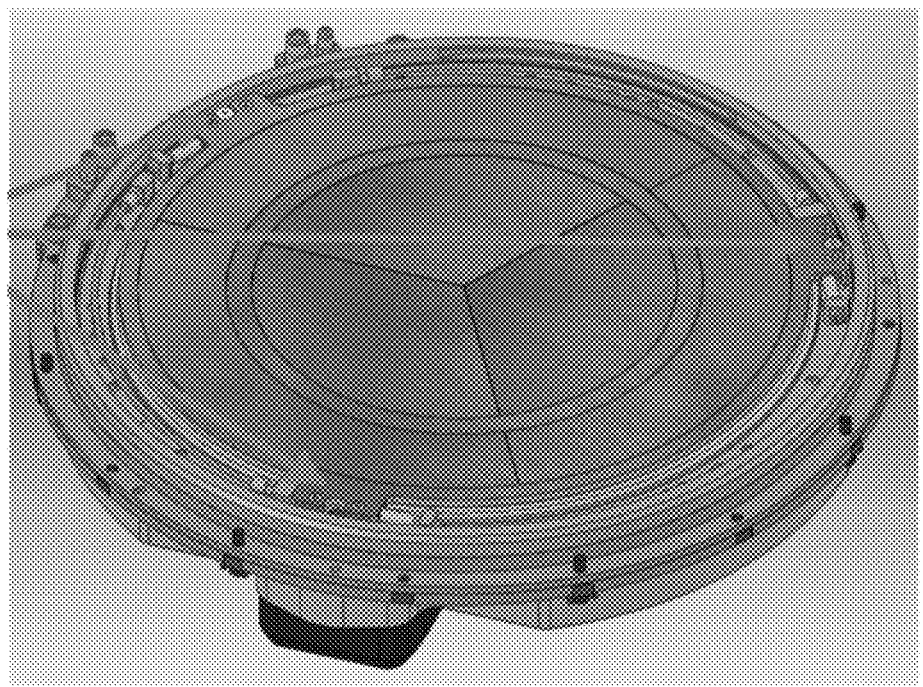
FIG. 9 depicts the top chuck of the temporary wafer bonder module of FIG. 2.
Figure 10A:
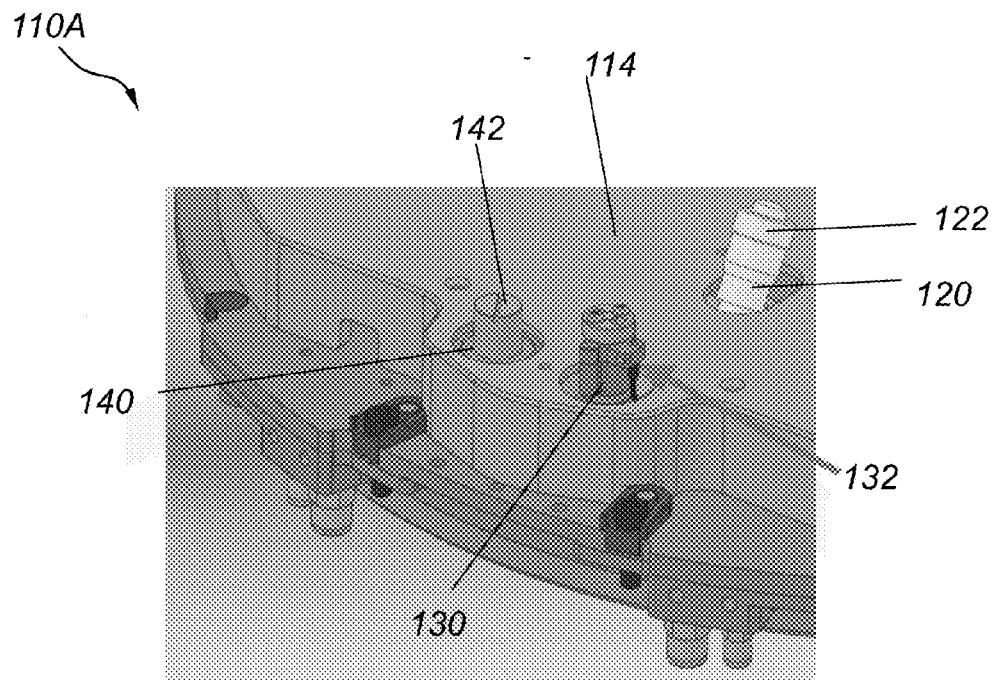
FIG. 10A depicts the adjustment components of the top chuck of FIG. 9 with the cover removed and the top lid in place.
Figure 10B:
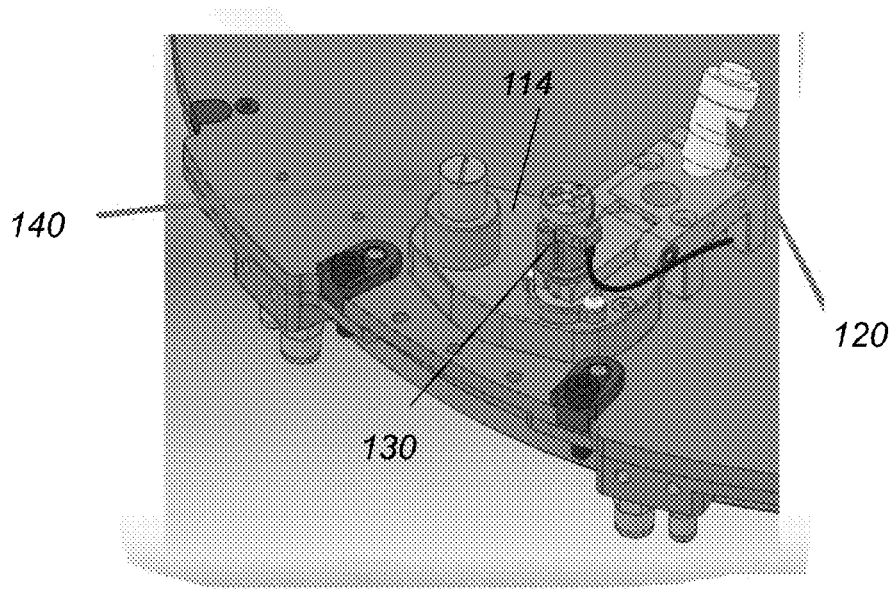
FIG. 10B depicts the adjustment components of the top chuck of FIG. 9 with the cover and the top lid removed.
Figure 11A:
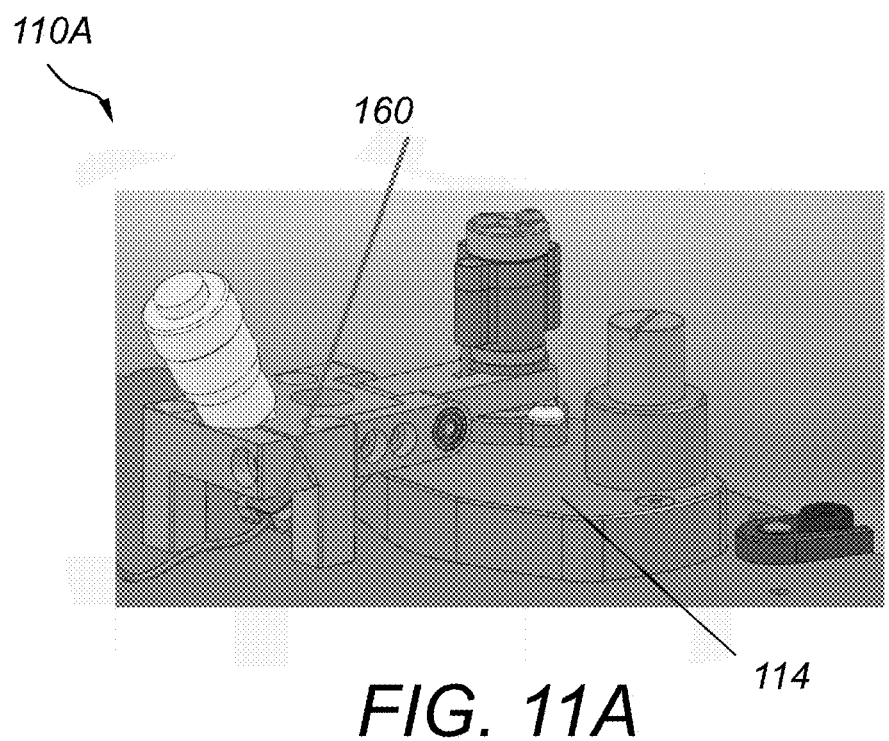
FIG. 11A is a perspective view of the adjustment components of the top chuck of FIG. 9.
Figure 11B:
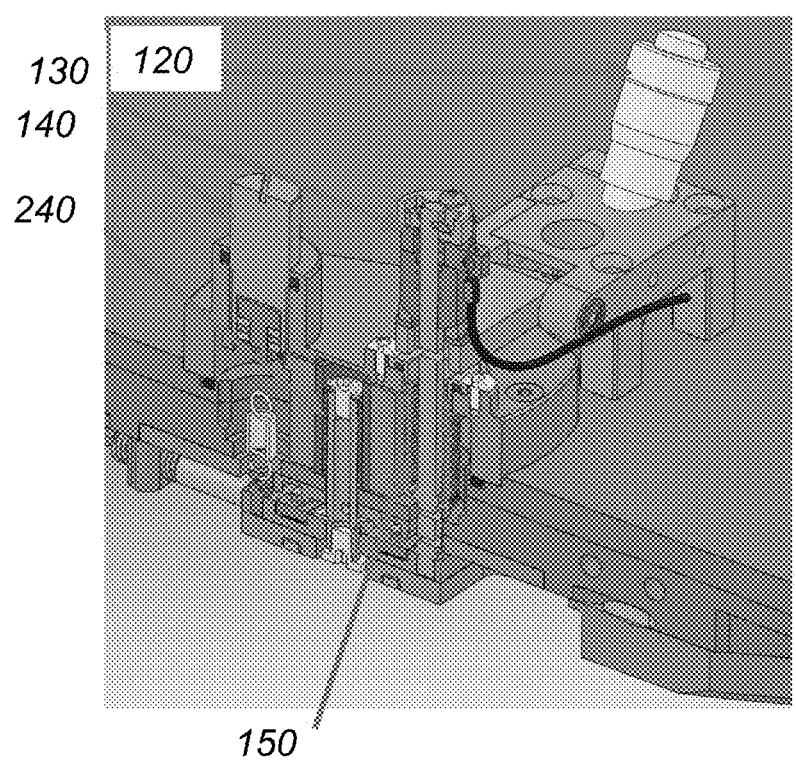
FIG. 11B is a cross-sectional view of the adjustment components of FIG. 11A.

Referring to FIG. 6, the upper block assembly 220 includes an upper ceramic chuck 222, a top static chamber wall 221 against which the curtain 235 seals with seal element 235a, a 200 mm membrane layer 224a, and a 300 mm membrane layer 224b. The membrane layers 224a, 224b, are clamped between the upper chuck 222 and the top housing wall 213 with clamps 215a, 215b, respectively, and form two separate vacuum zones 223a, 223b designed to hold 200 mm and 300 mm wafers, respectively. Membrane layers 224a, 224b are made of elastomer material or metal bellows. The upper ceramic chuck 222 is highly flat and thin. It has low mass and is semi-compliant in order to apply uniform pressure upon the stacked wafers 20, 30. The upper chuck 222 is lightly pre-loaded with the three adjustment mechanisms 110A, 110B, 110C. Adjustment mechanisms 110A, 110B, 110C are circularly arranged at 120 degrees and are used to adjust the chuck pre-load force, detect contact or joining of the substrates and adjust the level of the upper chuck 222 relative to the lower chuck 232. The upper chuck 222 is initially leveled while in contact with the lower chuck 232, so that it is parallel to the lower chuck 232.

Figure 5A:
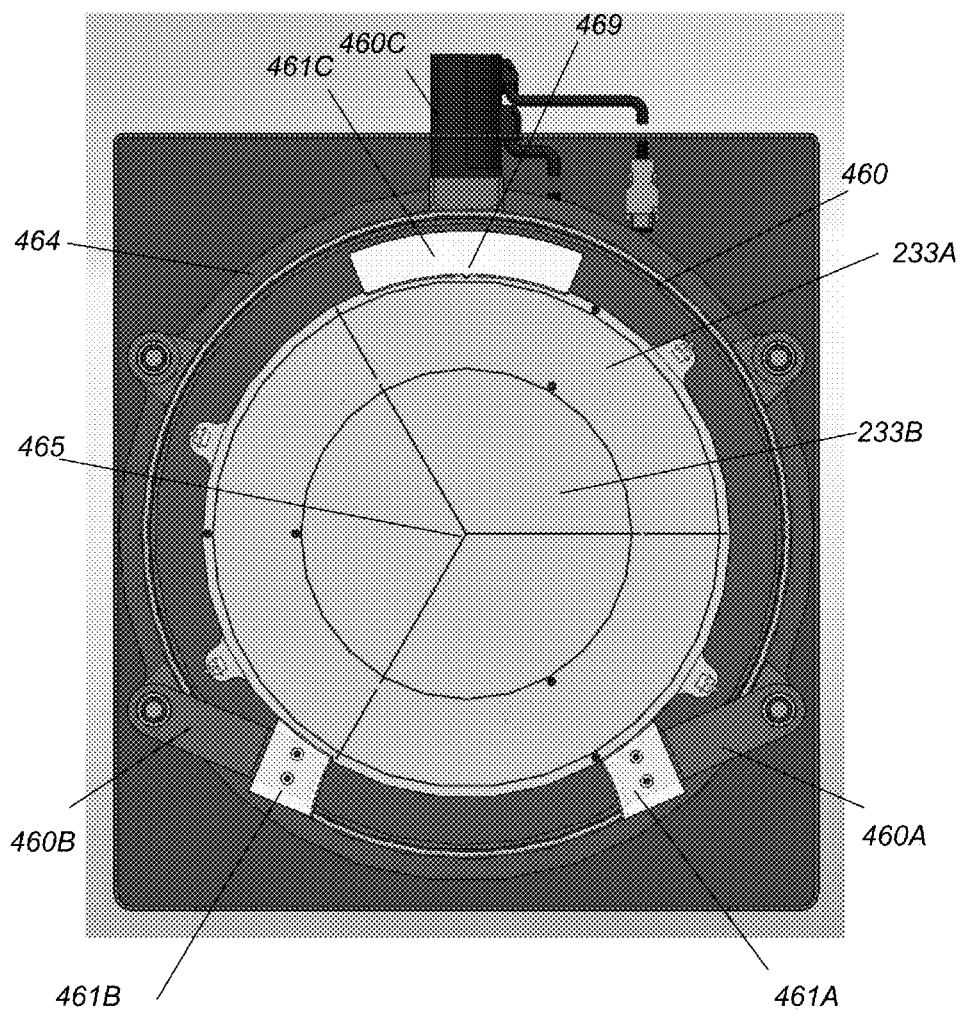
FIG. 5A depicts a wafer centering device with the pre-alignment arms in the closed position.

The loading and pre-alignment of the wafers is facilitated with the mechanical centering device 460, shown in FIG. 5A. Centering device 460 includes two rotatable pre-alignment arms 460a, 460b and a linearly moving alignment arm 460c, shown in the closed position in FIG. 5. At the ends of each arm 460a, 460b there are mechanical jaws 461a, 46 lb. The mechanical jaws 461a, 461b have tapered surfaces 462 and 463 that conform to the curved edge of the 300 mm wafer and 200 mm wafer, respectively. The linearly moving arm 460c has a jaw 461c with a tapered curved inner surface that also conforms to the curved edge of circular wafers. Jaw 461c also includes a notch finding mechanism that locates notch 469, which is formed at the curved edge of the circular wafer. Rotating arms 460a, 460b toward the center 465 of the support chuck 464 and linearly moving arm 460c toward the center 465 of the support chuck 464 brings the tapered surfaces of the mechanical jaws 461a, 461b and the tapered curved inner surface of jaw 461c in contact with the outer perimeter of the wafer and centers the wafer on the support chuck 464. The three arms 460a, 460b, 460c are arranged at 120 degrees around the support chuck 464. In another embodiment, the centering device 460 includes three rotatable pre-alignment arms, and at the ends of each arm there are mechanical jaws. Rotating the arms toward the center of the support chuck 464 brings the tapered surfaces of the mechanical jaws in contact with the outer perimeter of the wafer and centers the wafer on the support chuck 464. Other embodiments for loading and pre-alignment of the wafers are described in U.S. patent application Ser. No. 12/761,044 filed Apr. 15, 2010 and entitled "DEVICE FOR CENTERING WAFERS", the contents of which are expressly incorporated herein by reference.

Figure 5B:
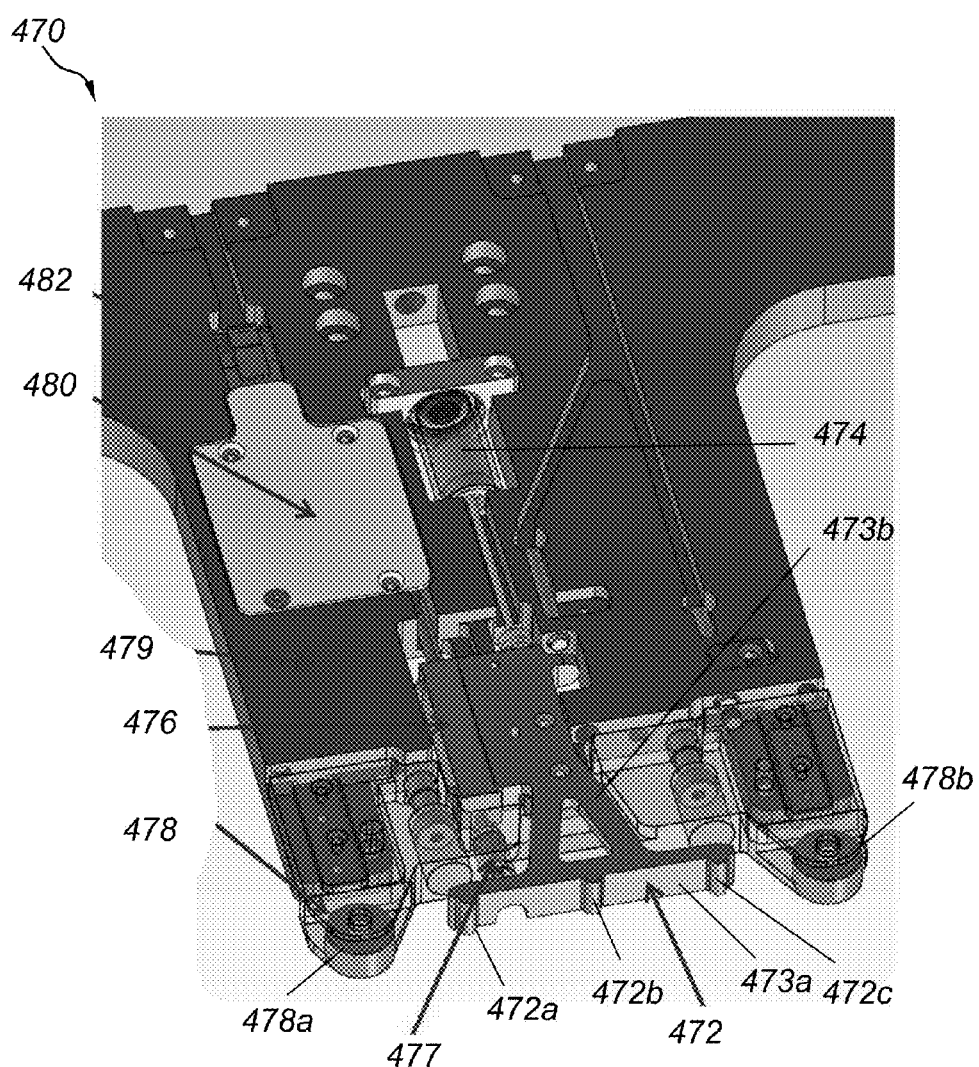
FIG. 5B depicts the notch finding mechanism used in the wafer centering device of FIG. 5A.
Figure 5C:
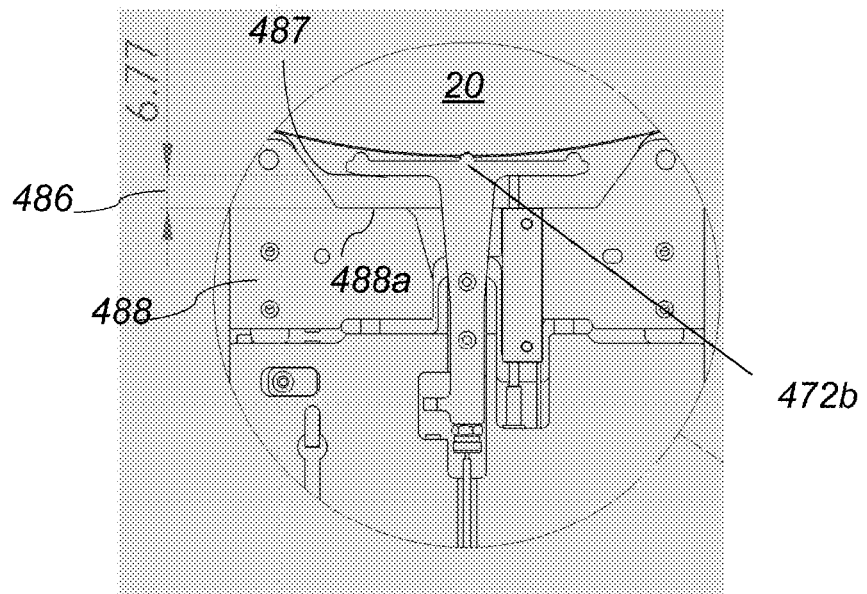
FIG. 5C depicts a 300 mm wafer with the notch finder fully engaged in the wafer notch.
Figure 5D:
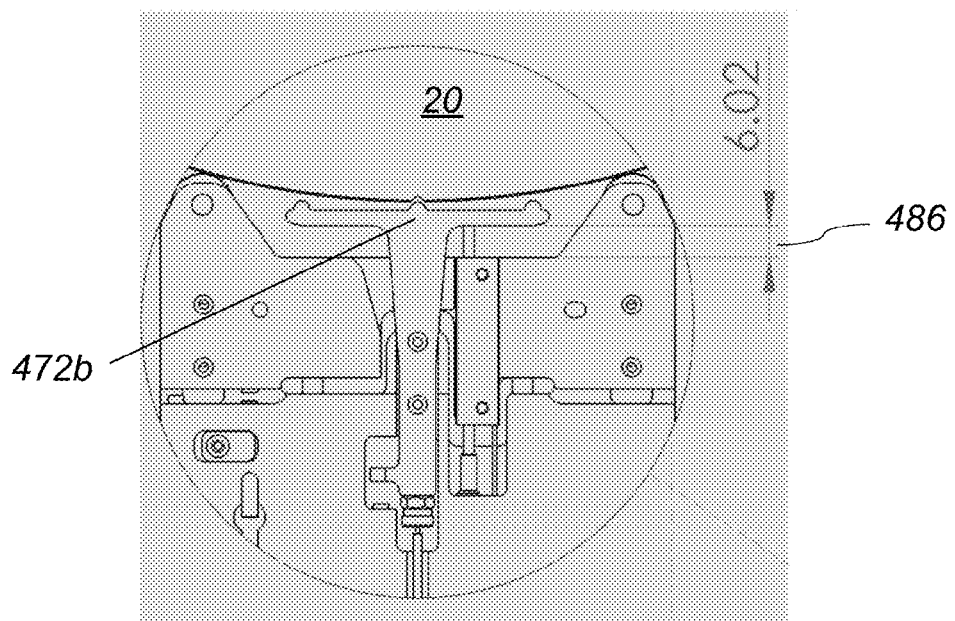
FIG. 5D depicts a 300 mm wafer with the notch finder not-fully engaged in the wafer notch.

Referring to FIG. 5B, notch finding mechanism 470 includes a notch finder 472, a position sensor 476, a floating joint connection 477, roller nose carriages 478, a motion cam plate 479, a service loop compartment 480, piston or motor 474, and front plates 488. Front plates 488 support the roller nose carriages 478. Notch finder 472 includes an elongated component 473a and a triangular component 473b. Elongated component 473a forms partially the base of the triangular component 473b. Elongated component 473a also includes three protrusions 472a, 472b, 472c that extend from the front surface of component 473a and are shaped so that they complement the shape of the wafer notch 469 or a flat feature in the wafer perimeter. For the case of a wafer with flat feature in the wafer perimeter, side protrusions 472a and 472c are located slightly forward of center protrusion 472b and are used for locating the substrate flat feature. Notch finder 472 is driven forward by piston or motor 474 and the relative distance 486 between the back surface 487 of component 473a and the front surface 488a of front plate 488 is measured with the position sensor 476, as shown in FIG. 5C. In one example, position sensor 476 is a linear potentiometer. Floating joint connection 477 connects the front of position sensor 476 to the back surface of component 473a. Roller nose carriage 478 includes rollers 478a, 478b that roll around the perimeter of the wafer, as shown in FIG. 5C and FIG. 5D. The relative distance 486 is measured from the front surface 488a of front plate 488 in order to allow for wafers with different sizes (i.e., 200 mm and 300 mm wafers), since the notch engagement positions are not the same for different size wafers. In one example, when there is a full engagement between protrusion 472b and notch 469 in a 300 mm wafer, the distance 486 is 6.77 mm, as shown in FIG. 5C. When there is not a full engagement between protrusion 472b and notch 469, the distance 486 is smaller (i.e., 6.02 mm), as shown in FIG. 5D. This distance measurement is used to confirm whether there is full engagement or not between the notch finder 472 and the notch 469 in wafer 20.

Referring to FIG. 7-FIG. 16, chamber 210 includes a top lid 212a that is removably attached to the top 109 of chamber 210 with screws 109. As was mentioned above, three adjustment mechanisms 110A, 110B, 110C are located outside of the process chamber area 202 and are accessible from the outside of the top lid 212a. Each adjustment mechanism 110A, 110B, 110C includes a removable cover 111 and components that are used for sensing contact 130, adjusting the tension 140 and leveling 120 the top chuck 222. As shown in FIG. 10A, cover 111 is removed and the adjusting elements 122, 132, 142 of the three components 120, 130, 140, respectively, are exposed so that they can be operated from the top in order to adjust the leveling, contact and tension of the upper chuck 222. All adjustments can be performed while the chamber 210 is at vacuum pressure or at atmospheric pressure.

Referring to FIG. 10B-FIG. 12, the adjustment mechanism 110A includes a leveling adjustment component 120, a contact sensing component 130 and a tension adjusting component 140. As shown in FIG. 11B, feed-through design 150 through the component vacuum seal cover 114 allows for the corresponding adjusting elements and sensors 122, 132, 142 to be located outside of the process chamber 202. Each adjustment mechanism also includes a load cell 160 for measuring the chuck 222 pre-load force accurately, as shown in FIG. 11A. Also shown in FIG. 11B is the chuck alignment pin 240, which is guided via an enhanced low friction bearing.

Figure 12:
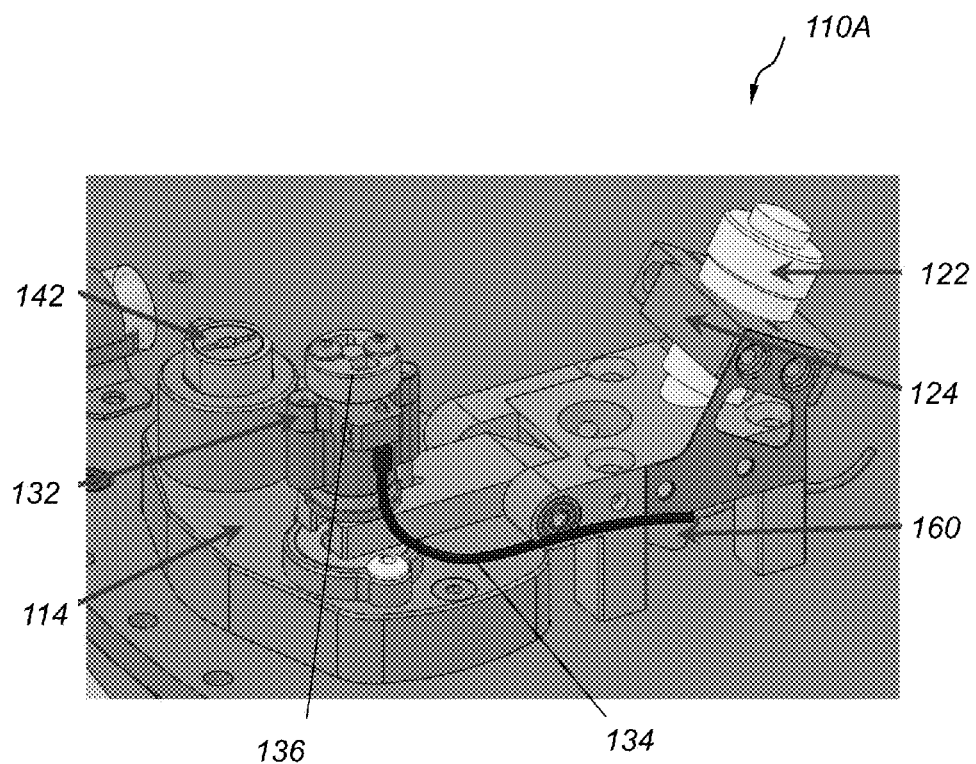
FIG. 12 is another perspective view of the adjustment components of FIG. 11A.
Figure 13:
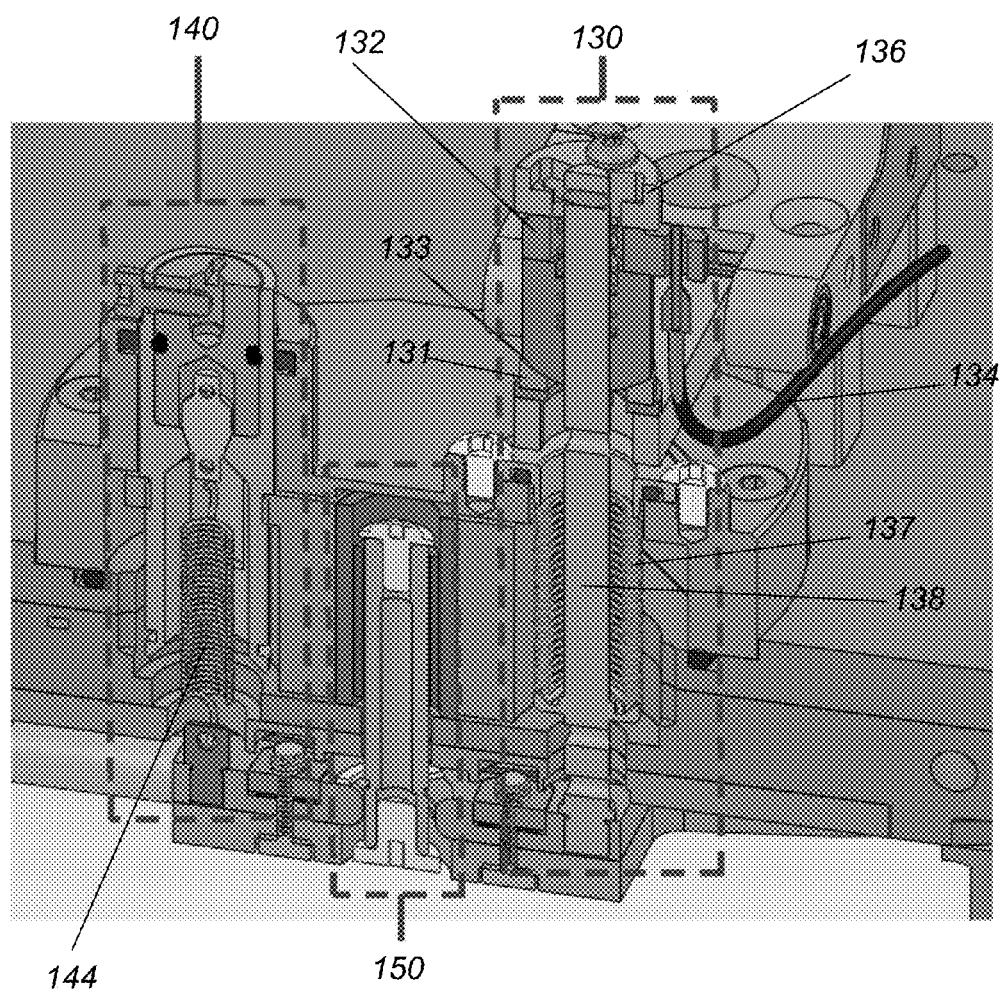
FIG. 13 is a detailed cross-sectional view of the tension adjustment component, chuck locating component and the contact sensor component.
Figure 14:
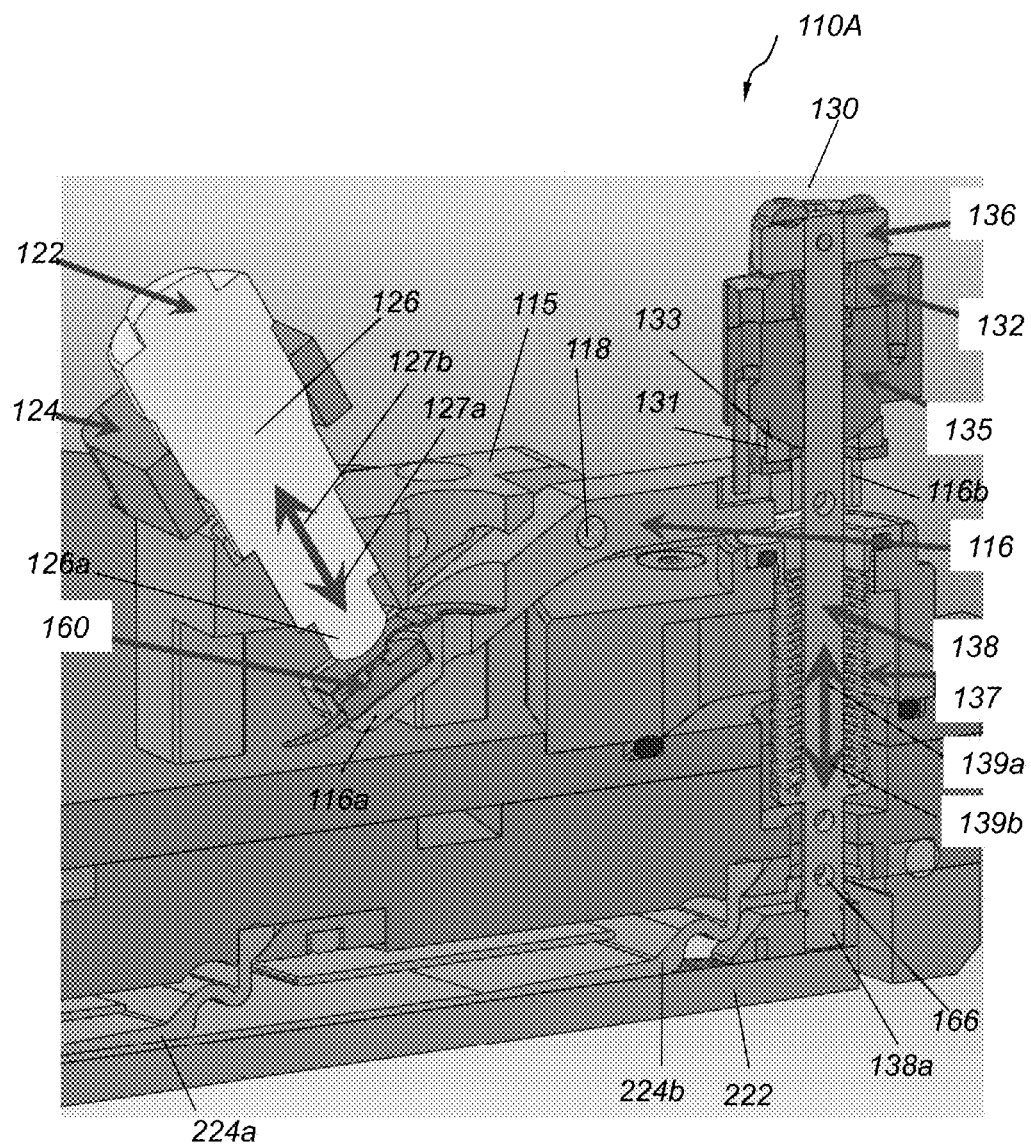
FIG. 14 is a detailed cross-sectional view of the leveling adjustment component and the contact sensor component.

As shown in FIG. 12, and FIG. 14, leveling component 120 includes a leveling adjusting micrometer 122, a micrometer shaft 126 and a micrometer locking clamp 124. Micrometer 122 has a resolution of 1 micrometer and the locking clamp 124 is used to lock the position of the micrometer after it has been set to a desired level. Micrometer shaft 126 passes through an opening in a support plate 115 and has a distal end 126a that contacts an end 116a of a pivot arm 116. Pivot arm 116 is pivotaly connected to the support plate 115 via pivot 118. End 116a also includes the force load cell 160 that is used for measuring the chuck pre-load force accurately. The opposite end 116b of the pivot arm 116 connects to a feed-through shaft 138 of the contact sensor 132. Feed-through shaft 138 passes through an opening formed at end 116b of the pivot arm. The contact sensing component 130 includes a contact sensor 132 that is powered via a DC signal provided through the cable 134 and a ground 136. In one example, he DC signal is 24 V. Contact sensor 132 is connected to the feed-through shaft 138 that is surrounded by a bellow 137. Contact sensing component 130 also includes a contact guide and pre-load spring 135, and a spherical bearing interface 133. The spherical bearing interface 133 contacts a thrust washer 131 that surrounds the feed-through shaft 138 and is supported by the pivot arm end 116b. The distal end 138a of the feed-through shaft 138 is rigidly attached to the top surface of the upper chuck 222. Feed-through shaft 138 is made of a material with low coefficient of thermal expansion (CTE). In one example, feed-through shaft 138 is made of invar. Thermal isolation between the upper chuck 222 and the feed-through shaft 138 is provided via thermal break points 166.

Rotating the micrometer 122 clockwise, moves the micrometer shaft 126 down along direction 127a. As was mentioned above, the distal end 126a of micrometer shaft 126 is connected to end 116a of the pivot arm 116 that pivots around pivot 118. Moving the micrometer shaft 126 down along direction 127a, moves end 116a of the pivot arm 116 down and end 116b up. Since end 116b of pivot arm 116 is connected to the feed-through shaft 138, the upward motion of end 116b moves the feed-through shaft 138 up along direction 139a. Rotating the micrometer 122 counter-clockwise, moves the micrometer shaft 126 up along direction 127b. Moving the micrometer shaft 126 up along direction 127b, moves end 116a of the pivot arm 116 up and end 116b down. The downward motion of end 116b moves the feed-through shaft 138 down along direction 139b. When the upper chuck 222 and the distal end 138a of the feed-through shaft 138 which is rigidly attached to the upper chuck 222, are moved upward by the approaching lower chuck or lower chuck holding a substrate, the contact sensor 132 registers a signal.

Figure 15:
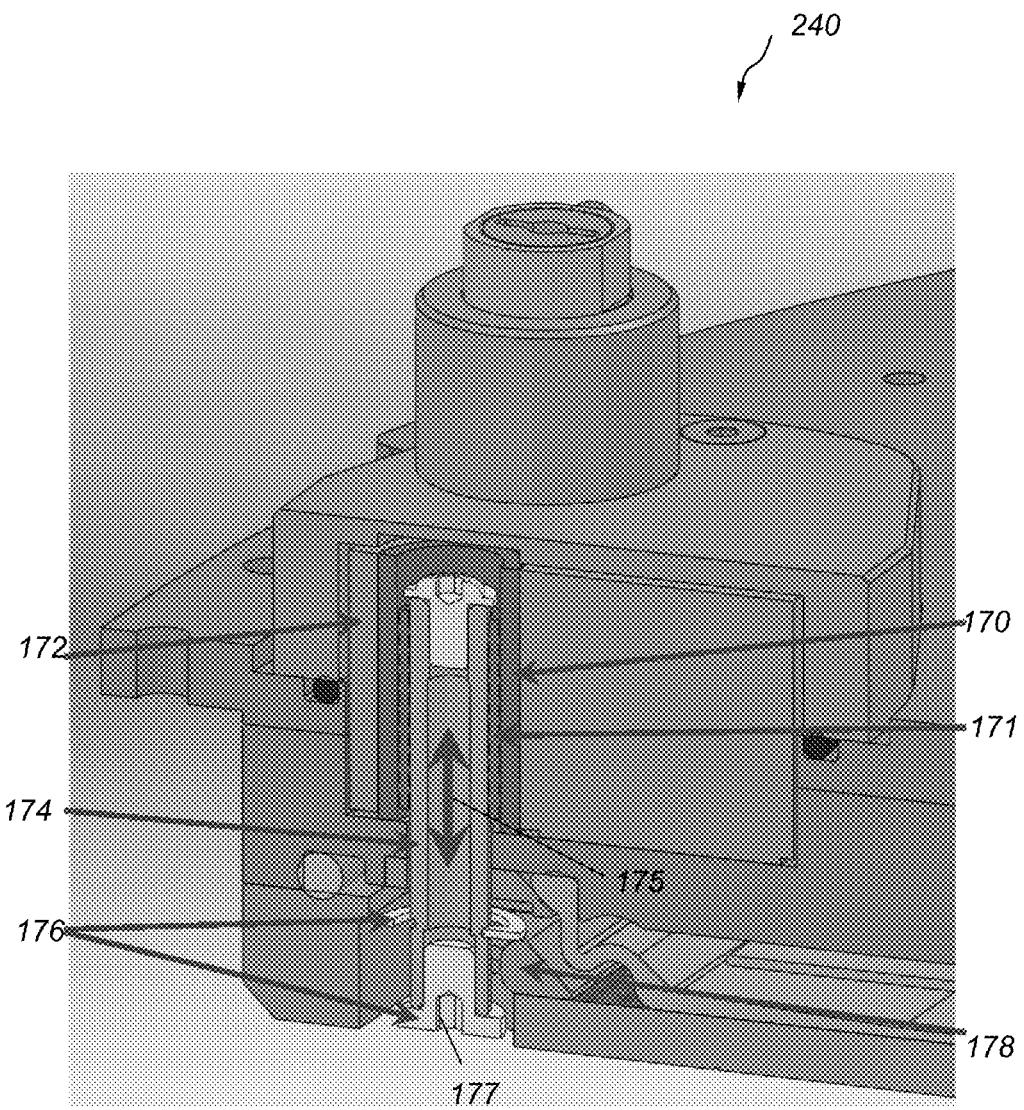
FIG. 15 is a detailed cross-sectional view of the top chuck alignment component.

Referring to FIG. 15, each chuck alignment pin 240 is guided via an enhanced low friction bearing. The low friction bearing includes a base block 172 that surrounds a ball bearing bushing 170, a ball bearing case 171, and a moving guide shaft 174. Pins 240 also include chuck retention hardware 176 that contact the upper chuck locating blocks 179. Each pin 240 also includes a guidance pin opening 177.

Figure 16:
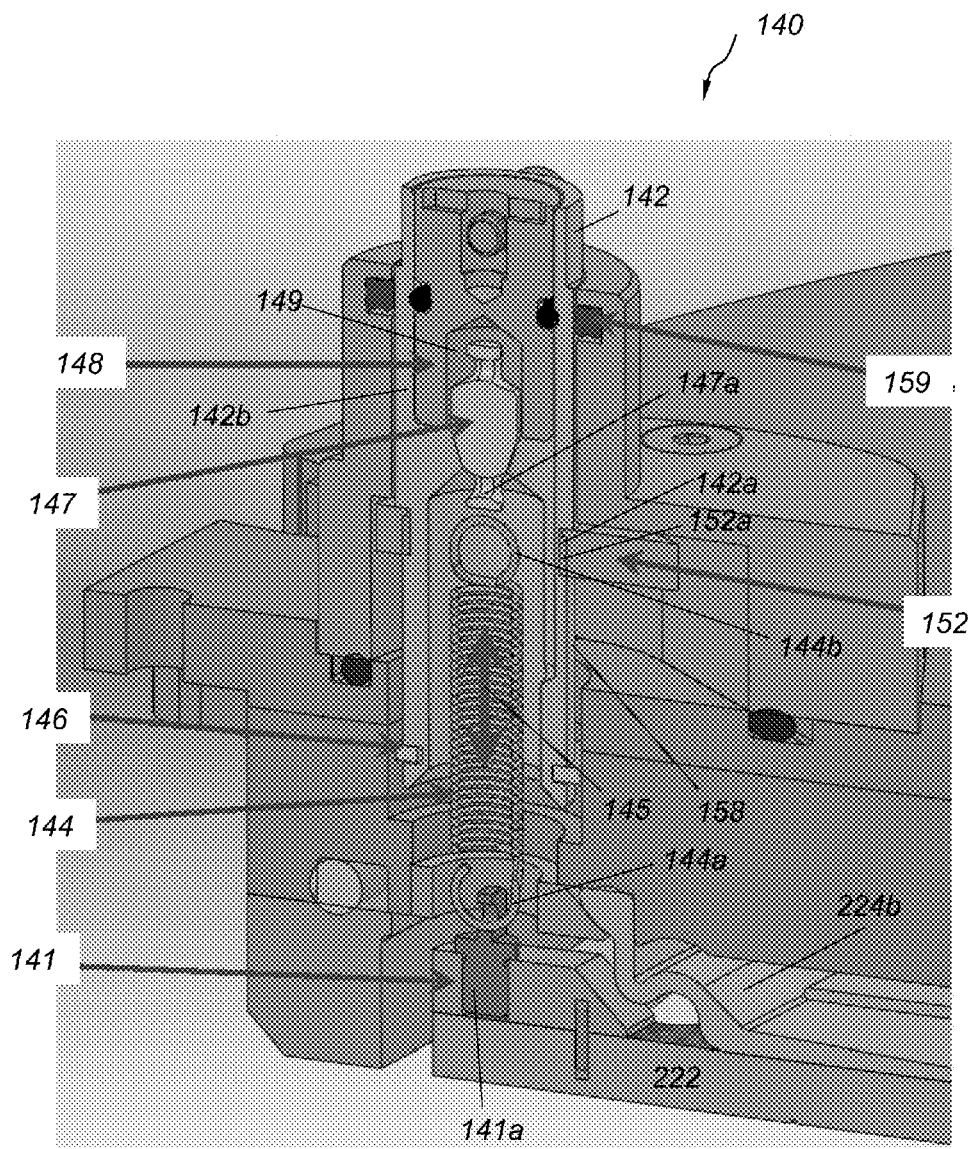
FIG. 16 is a detailed cross-sectional view of the tension adjustment component.

Referring to FIG. 16, the tension adjusting component 140 includes a screw 142 that is rotated to adjust the chuck 222 upward tension by extending or contracting a tension spring 144 along direction 145. Screw 142 includes a plug 148 that is retained within through-opening 142b and has a swivel bearing capture 149. The swivel bearing capture 149 retains a swivel bearing 147. The swivel bearing 147 has a hook at the distal end 147a that captures a loop at the proximal end 144b of the spring 144. The distal end 144a of spring 144 has a hook that engages a hook formed in a spring anchor 141a that is located in the upper chuck locating block 141. Screw 142 includes outer threads 142a which are located and configured so that they engage inner threads 158a formed in the inner walls of feed-through opening 158 formed in the base block 152 and seal cover 114. Upward motion of the tension spring 144 is limited by circular clips 146.

Figure 17:
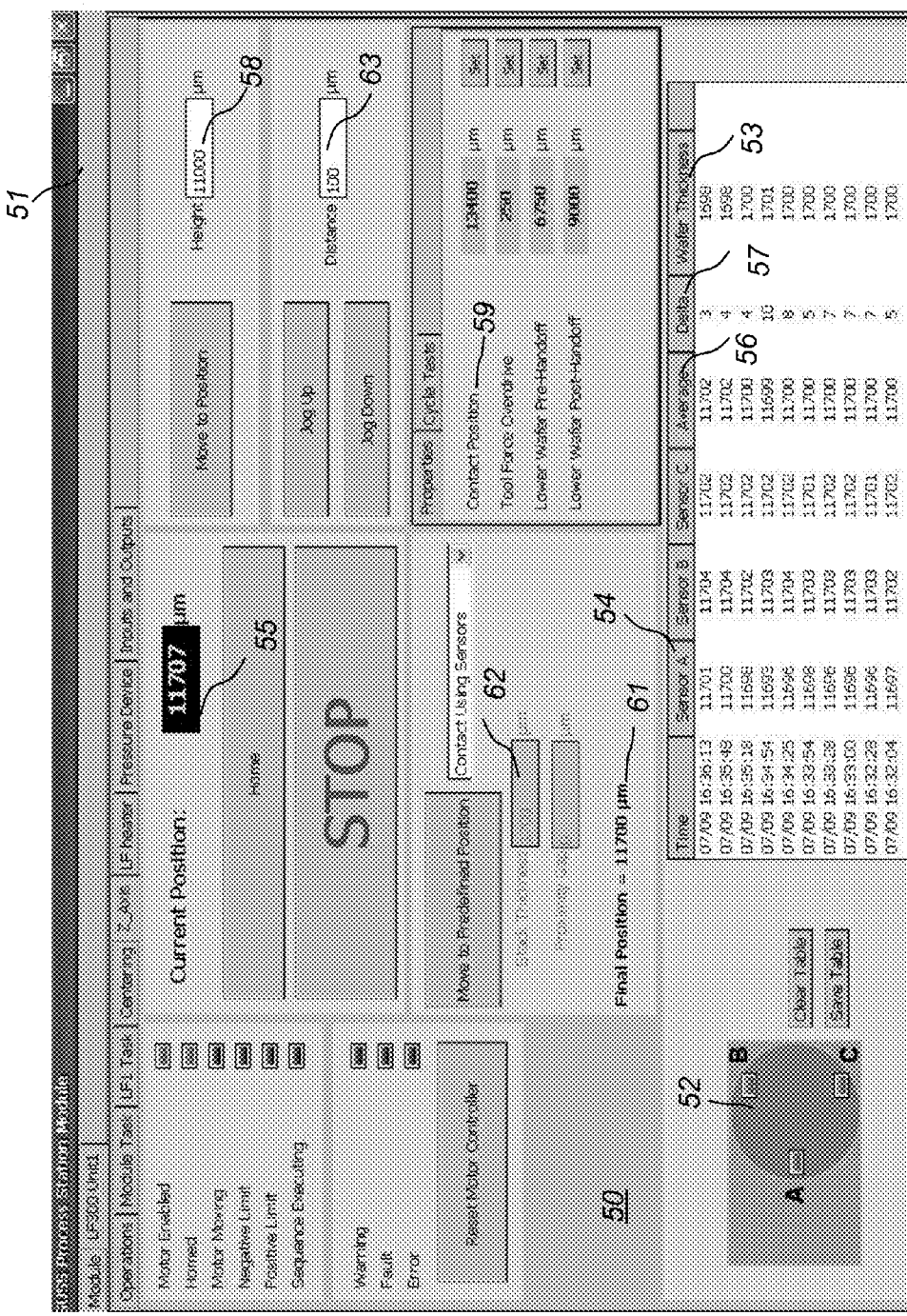
FIG. 17 is a screenshot of the wafer adjustment application.
Figure 18A:
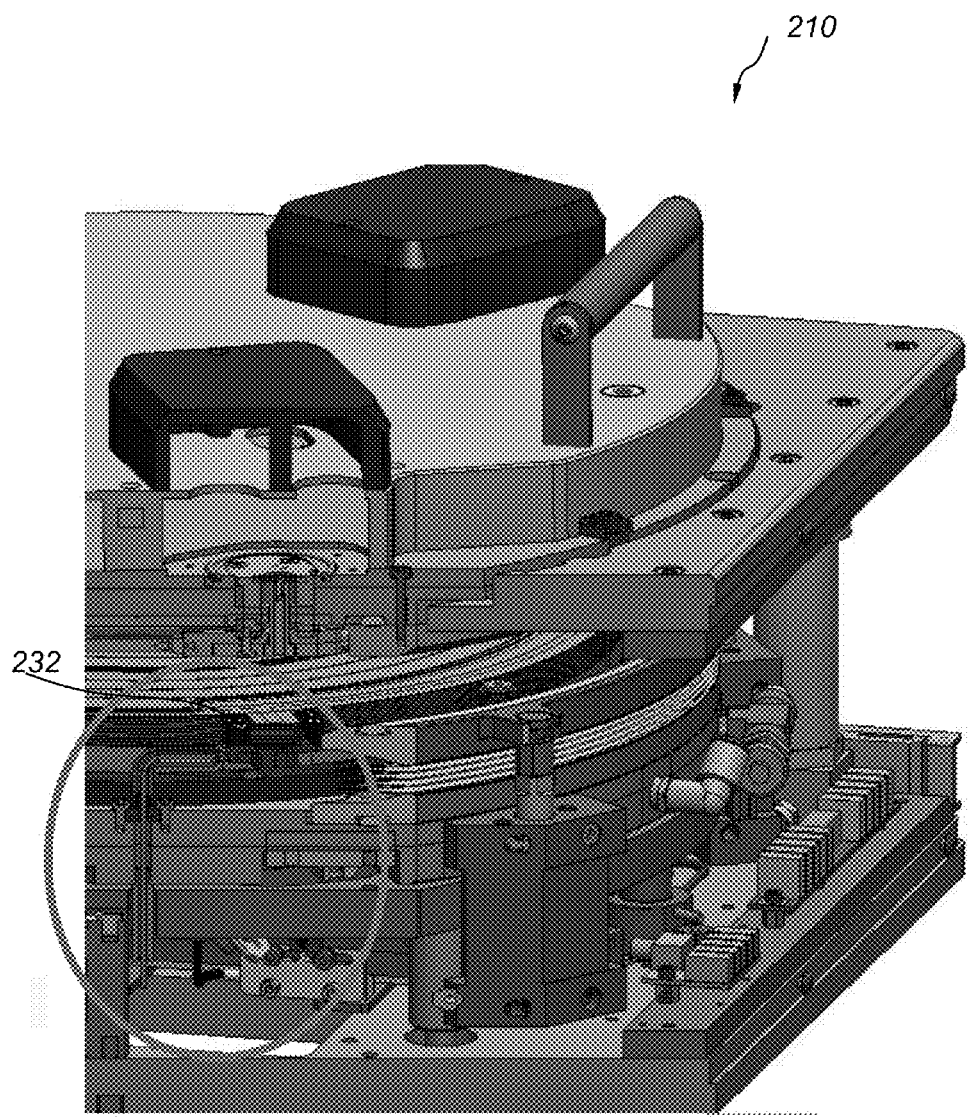
FIG. 18A is a side cross-sectional view through the lower heater/electro-static chuck interconnection of the temporary bonder module of FIG. 2.
Figure 18B:
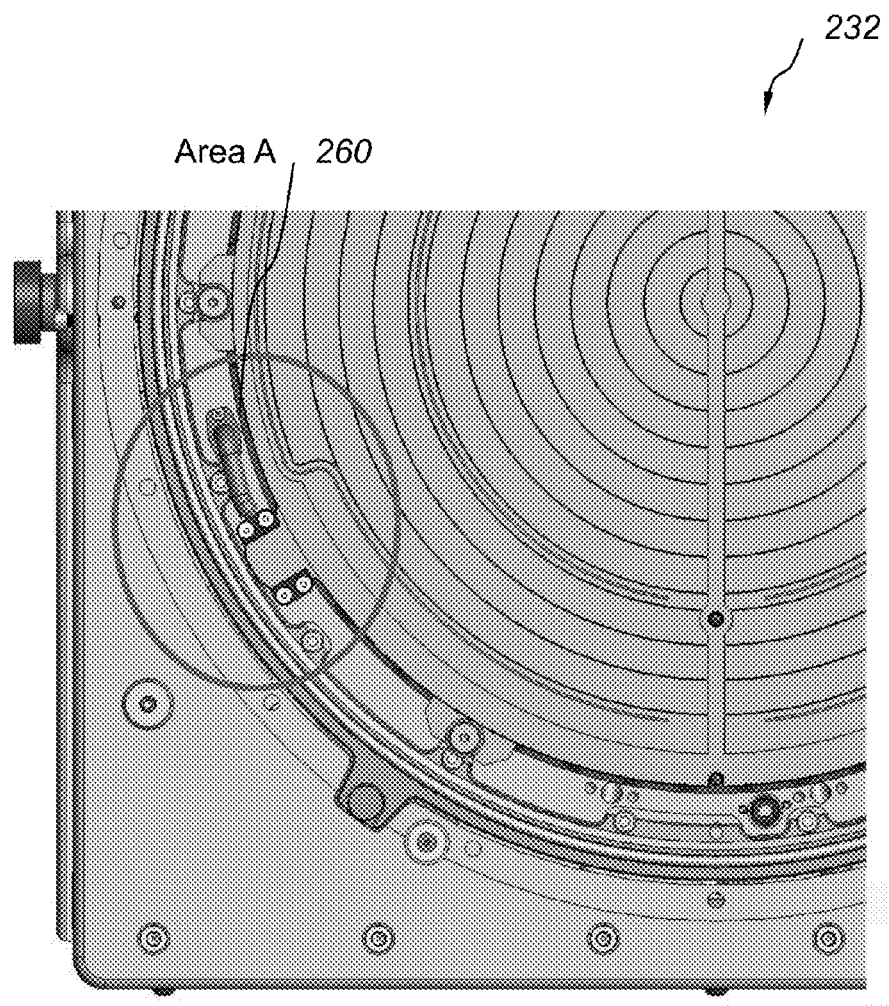
FIG. 18B is a top view of the lower heater/electro-static chuck area A of the temporary bonder module of FIG. 17.
Figure 19A:
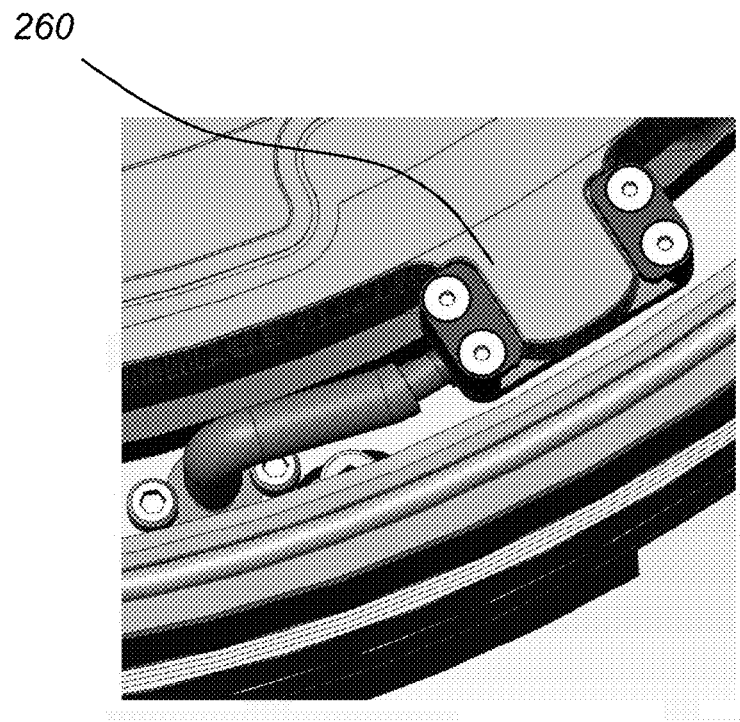
FIG. 19A is an enlarged view of area A of FIG. 18B.
Figure 19B:
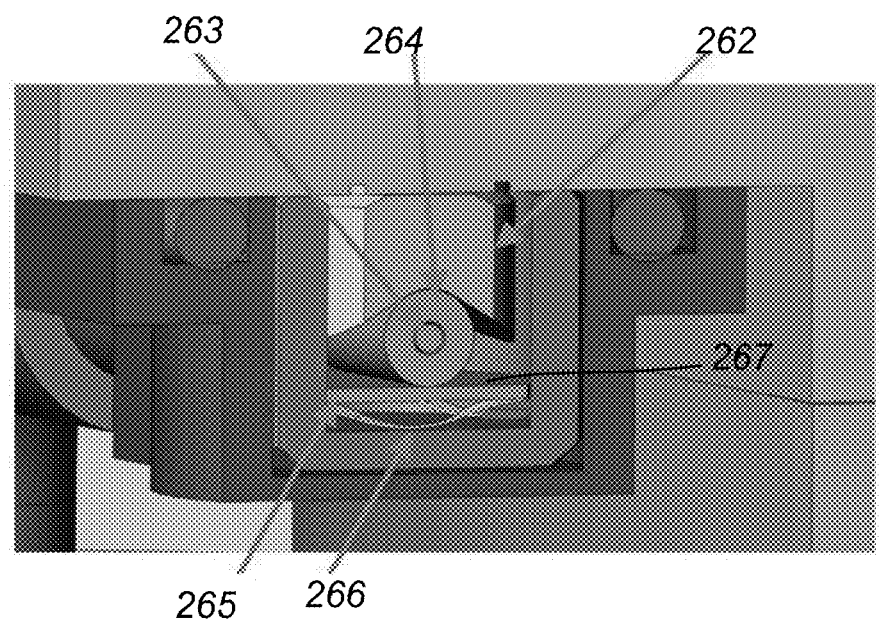
FIG. 19B is an enlarged side cross-sectional view of area A of FIG. 18B.
Figure 20:
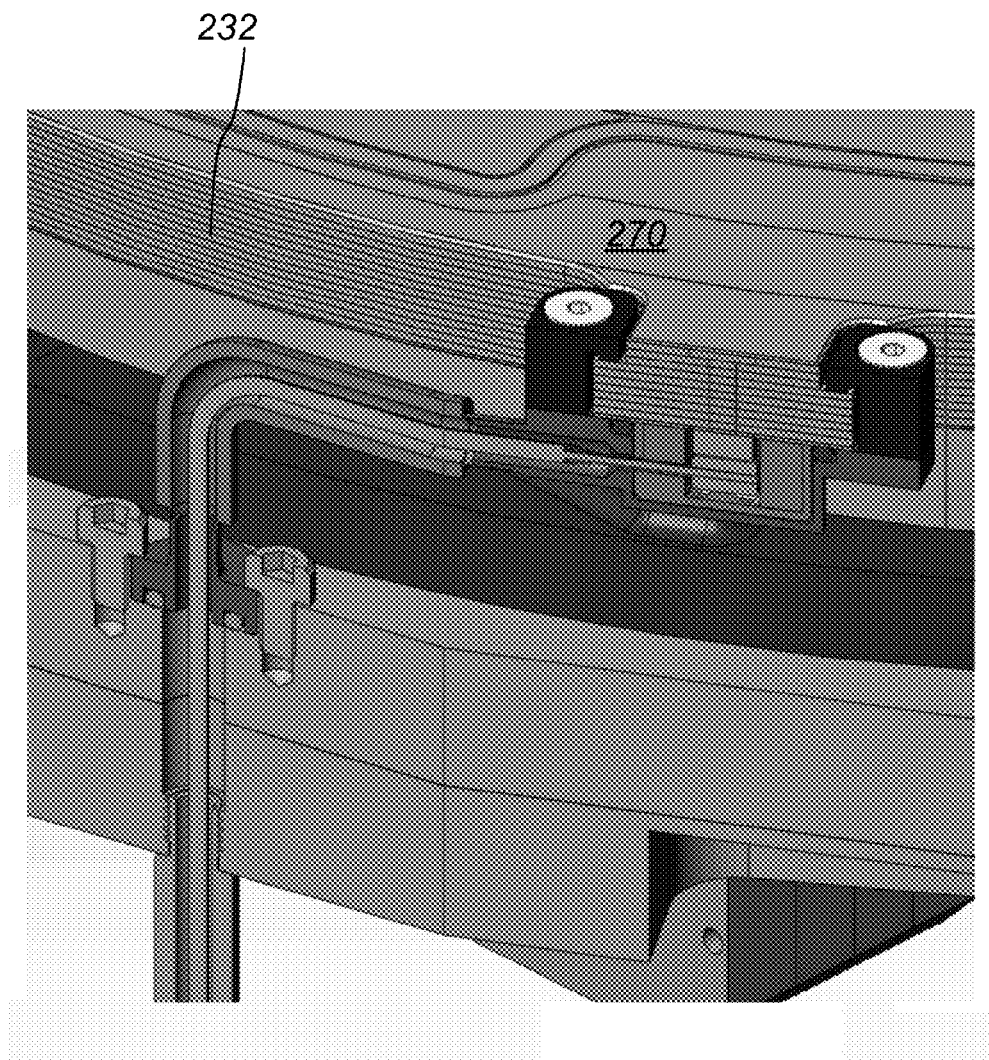
FIG. 20 is a cross-sectional view of area A of FIG. 18B.
Figure 21:
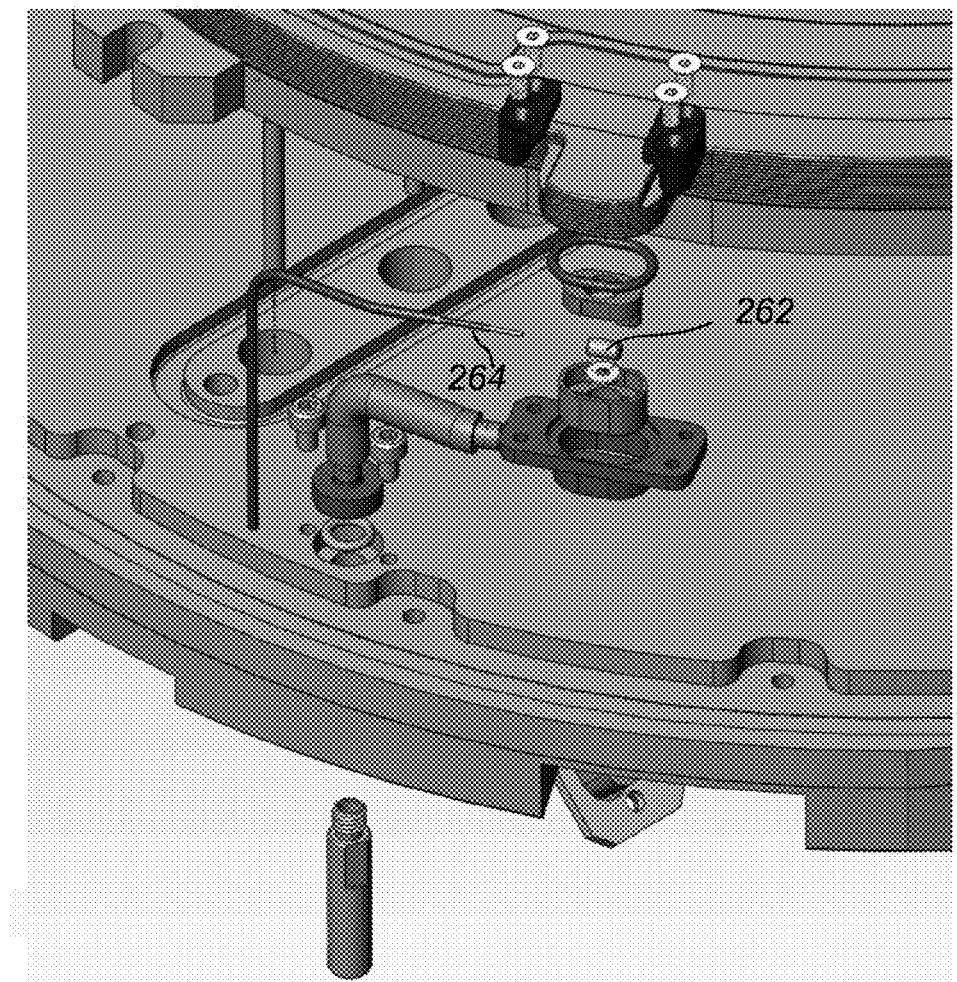
FIG. 21 is an exploded view of area A of FIG. 18B.

In operation, the leveling, tensioning and positioning of the top chuck 222 are controlled by the leveling, tension and contact components of the three adjustment mechanism 110A, 110B, 110C. In one embodiment, the leveling and tension components are adjusted manually by rotating micrometer 122 and screw 142, respectively, and contact between the wafers is guided via a computer application 50. Referring to FIG. 17, a screen 51 of the computer application 50, includes an image 52 of the three contact sensors A, B, C in the corresponding adjustment mechanism 110A, 110B, 110C, their position 54, the average value 56 and the delta value 57. The top chuck 222 is set to move to a height that is set in block area 58 and then contact between the wafers 20, 30 is guided via the contact sensors in the adjustment mechanisms 110A, 110B, 110C. When the two wafers 20, 30 contact each other, top chuck 222 moves upwards causing sensor 132 to separate from ground 136 and thus contact sensor 132 registers a signal. When sensor 132 registers a signal the image 52 of the corresponding sensor A, B, C, lights up in the screen 51. The speed of the motion slows down at a user defined distance before the expected contact position of the top chuck. In the example of FIG. 17, top chuck 222 is set to move to a contact position 59 of 13400 micrometers. The thickness 62 of the two-wafer stack including the adhesive is 1700 micrometers. Subtracting the thickness of the wafer stack from the contact position results in a final position 61 of 11700 micrometers.

The application 50 directs the controller to move to a configurable "approach" position and then it uses a configurable slower velocity motion until contact is detected by sensors A, B and C. The contact position for each sensor is indicated in columns 54, the average in column 56 and the delta in column 57. In other embodiments, the leveling and tension components are also adjusted via computer application 50.

Referring to FIG. 18A-FIG. 21, in one embodiment, the lower block assembly 230 includes an electrostatic lower heater chuck 232. The electrostatic chuck 232 holds the wafer 20 in a secure locked position and prevents accidental wafer movement due to vibrations, thermal expansion or gas flowing in the chamber. Electrostatic chuck 232 includes a ceramic heater with the integrated heating wires and a thin dielectric layer 270 on the top. In this embodiment the electrical interconnections 260 include an electrode block 262 and a wire conductor 263 that is surrounded by a crimp ferrule 264. Electrode block 262 is brazed at the bottom of the ceramic heater 232 and is placed on top of the crimp ferrule 264 and the conductor 263. Block 262, ferrule 264 and conductor 263 are housed within an opening 267 formed at the edges and underneath the lower chuck surface, as shown in FIG. 19B. Block 262 presses against the conductor 263 and the conductor 263 presses against a metal clamping disk 265 that is located at the bottom of opening 26. Metal clamping disk presses against a wave-type spring washer 266.

Several embodiments of the present invention have been described. Nevertheless, it will be understood that various modifications is made without departing from the spirit and scope of the invention. Accordingly, other embodiments are within the scope of the following claims.

What is claimed is:

1. A device for centering circular wafers, comprising:
a support chuck for supporting a circular wafer to be centered upon its top surface;
a first rotationally movable alignment aim being rotatable around an axis perpendicular to the top surface of the support chuck and comprising a first mechanical jaw, said first mechanical jaw comprising a tapered curved edge surface conforming to the curved edge of the circular wafer;
a second rotationally movable alignment arm being rotatable around an axis perpendicular to the top surface of the support chuck and comprising a second mechanical jaw, said second mechanical jaw comprising a tapered curved edge surface conforming to the curved edge of the circular wafer;
a third linear moving alignment arm, being movable linearly along a first axis toward the center of the support chuck and comprising a tapered curved inner surface conforming to the curved edge of the circular wafer and a notch locating mechanism configured to locate a notch or a flat feature formed on the perimeter of the circular wafer, the notch locating mechanism comprising a notch locating component;
wherein said first, second and third alignment arms are arranged around the support chuck at an angle of 120 degrees from each other; and
wherein the circular wafer is placed on the support chuck and is centered and aligned by first rotating the first and second alignment arms toward the center of the support chuck so that the tapered curved edge surfaces of the first and second mechanical jaws contact the outer perimeter of the circular wafer at first and second perimeter areas, respectively, and then by linearly moving the third alignment arm along the first axis toward the center of the support chuck until the notch locating mechanism locates and engages the notch formed on the perimeter the circular wafer;
wherein the notch locating component is configured to move linearly along the first axis toward the center of the support chuck and comprises a front elongated component extending along a second axis being coplanar with the support chuck and perpendicular to the first axis and wherein the front elongated component comprises a front surface, a back surface opposite to the front surface and a first protrusion extending from the front surface of the elongated component and wherein the first protrusion comprises a shape complementing the shape of the notch formed on the perimeter of the circular wafer;
a first plate arranged at a first side of the front elongated component;
wherein as the notch locating component is driven toward the perimeter of the circular wafer along the first axis, a distance between the back surface of the elongated component and a front surface of the first plate is measured and the value of the measured distance is used to determine engagement of the first protrusion with the notch.

2. The device of claim 1, further comprising:
a position sensor;
a floating joint connection configured to connect a front surface of the position sensor to the back surface of the front elongated component; and
wherein the position sensor is configured to measure the distance between the back surface of the elongated component and the front surface of the first plate, as the notch locating component is driven toward the perimeter of the circular wafer along the first axis.

3. The device of claim 2, wherein the position sensor comprises a linear potentiometer.

4. The device of claim 1, further comprising:
a second plate arranged at a second side of the front elongated component, opposite to the first side; and
wherein the first and second plates support first and second rollers respectively, and wherein the first and second rollers are configured to roll around the perimeter of the circular wafer.

5. The device of claim 1, further comprising second and third protrusions extending from the front surface of the front elongated component and being arranged left and right of the first protrusion, respectively, and wherein the second and third protrusions comprise a shape complementing the shape of the notch formed on the perimeter of the circular wafer.

6. The device of claim 1, wherein the notch locating component is driven toward the perimeter of the circular wafer along the first axis via a piston or a motor.

7. The device of claim 1, wherein the notch locating component comprises a triangular component and wherein the front elongated component forms partially the base of the triangular component.

* * * * *

UNITED STATES PATENT AND TRADEMARK OFFICE
CERTIFICATE OF CORRECTION

PATENT NO. : 9,859,141 B2
APPLICATION NO. : 14/330497
DATED : January 2, 2018
INVENTOR(S) : Johnson et al.

It is certified that error appears in the above-identified patent and that said Letters Patent is hereby corrected as shown below:

In the Claims

Column 9, Claim 1, Line 33, "aim" should read --arm--.

Signed and Sealed this
Twenty-fourth Day of April, 2018

Andrei Iancu
*Director of the United States Patent and Trademark Office*